United States Patent [19]

Shinoda et al.

[11] Patent Number: 4,604,749
[45] Date of Patent: Aug. 5, 1986

[54] SEMICONDUCTOR MEMORY

[75] Inventors: Takashi Shinoda, Kodaira; Kikuo Sakai, Hachiohji; Masahiro Ogata; Hiroshi Kawamoto, both of Kodaira; Yoshiaki Onishi, deceased, late of Kokubunji; Junko Onishi, administratrix, Nagoya, all of Japan

[73] Assignees: Hitachi, Ltd.; Hitachi Microcomputer Engineering Ltd., both of Tokyo, Japan

[21] Appl. No.: 502,636

[22] Filed: Jun. 9, 1983

[30] Foreign Application Priority Data

Jun. 9, 1982 [JP] Japan .................................. 57-97826
Jun. 9, 1982 [JP] Japan .................................. 57-97825

[51] Int. Cl.[4] ............................................. G06F 11/10
[52] U.S. Cl. ......................................... 371/38; 371/13
[58] Field of Search ................. 371/38, 13; 364/200, 364/900; 365/222, 201

[56] References Cited

U.S. PATENT DOCUMENTS

| 3,639,900 | 2/1972 | Hinz ..................................... 371/38 |
| 4,077,028 | 2/1978 | Lui et al. ............................. 371/38 |
| 4,216,541 | 8/1980 | Clouer et al. ........................ 371/38 |
| 4,225,959 | 9/1980 | Suelflow et al. ..................... 371/38 |
| 4,319,356 | 3/1982 | Kocol et al. ......................... 371/38 |
| 4,375,100 | 2/1983 | Tsuji et al. ........................... 371/38 |
| 4,446,459 | 5/1984 | Bond et al. ......................... 364/900 |
| 4,459,696 | 7/1984 | Kojima ................................. 371/38 |

Primary Examiner—Michael R. Fleming
Attorney, Agent, or Firm—Antonelli, Terry & Wands

[57] ABSTRACT

YA semiconductor memory is provided with memory cells for storing a plurality of sets of data, each of the sets having check bits. A selecting circuit selects some of the memory cells to form a set in response to a first address signal. The circuit includes an error correcting code circuit, a tristate circuit and a control circuit which forms a control signal to control the tristate circuit. Output terminals of the tristate circuit are coupled with external output terminals of the semiconductor memory. Also, the tristate circuit is controlled by the control signal to bring the external circuit terminals into high impedance at least during the time when the error correcting code circuit is delivering indefinite data.

3 Claims, 19 Drawing Figures

A $A_0 \sim A_{14}$
B $A_{15}, A_{16}$
C $D_{On}$

SEMICONDUCTOR MEMORY

BACKGROUND OF THE INVENTION

The present invention relates to a semiconductor memory and more particularly to a read only memory (referred to as "ROM" hereinafter).

With the recent development in semiconductor techniques and semiconductor device application techniques, there has been an increasing need for a semiconductor memory with a large capacity.

To obtain a ROM with a large capacity, various problems must be solved.

In a ROM with a large capacity, for example, a large number of memory cells are connected to each of the data lines. In consequence, the data lines are unfavorably coupled with stray or parasitic capacitance which is relatively large in value. In a ROM, for example, the content of data stored in a selected memory cell is judged according to whether, after the stray and parasitic capacitances coupled to the data line are precharged, the selected memory cell discharges the electric charge in its capacitance. More specifically, the data in the selected memory cell is judged according to whether, after the potential of the data line is raised to a predetermined value, the selected memory cell causes the data line potential to be lower than the predetermined value. Since a ROM with a large capacity has data lines unfavorably coupled with stray or parasitic capacitance which is relatively large in value, the selected memory cell requires a comparatively long time to make the data line potential become lower than a predetermined value. As a result, a ROM with a large capacity disadvantageously requires a relatively long time to read out data from a desired memory cell.

Moreover, in a ROM with a large capacity, the stray or parasitic capacitance coupled to the data lines has large values. Therefore, it takes a considerably long time from the time when precharging of the capacitances is started until the data line potential is made a predetermined value. In consequence, a ROM with a large capacity requires a relatively long time from one data output opertion to the subsequent data output operation.

It is desirable that the power consumption of the ROM be small from various points of view.

In addition, any defect in memory cells becomes a serious problem particularly in a ROM with a large capacity.

Hitherto, a circuit has been utilized, based on one of the known information theories, in which data error is corrected by employing an error correcting code (the circuit will be referred to as "ECC circuit" hereinafter).

Prior to this invention, the inventor contrived to improve the production yield of a semiconductor memory by incorporating an ECC circuit in a one-chip semiconductor memory thereby to redress a defective memory cell.

SUMMARY OF THE INVENTION

It is an object of the invention to provide a semiconductor memory capable of a high-speed operation.

It is another object of the invention to provide a semiconductor memory with a low power consumption.

It is still another object of the invention to provide a semiconductor memory having an improved production yield.

It is a further object of the invention to provide a semiconductor memory which will rarely malfunction.

It is a still further object of the invention to provide a semiconductor memory which is easy to handle.

The above and other objects, features and advantages of the invention will be apparent from the following description taken in connection with the accompanying drawings.

It is another object of the present invention to provide for improved data error correction.

To accomplish the above objects, and particularly the object of providing improved error correction, a semiconductor memory is provided with memory cells for storing a plurality of sets of data, each of the sets having check bits. A selecting circuit selects some of the memory cells to form a set in response to a first address signal. The circuit also includes an error correcting code circuit, a tristate circuit and a control circuit which forms a control signal to control the tristate circuit. Output terminals of the tristate circuit are coupled with external output terminals of the semiconductor memory. Also, the tristate circuit is controlled by the control signal to bring the external circuit terminals into high impedance at least during the time when the error correcting code circuit is delivering indefinite data.

DESCRIPTION OF THE PREFERRED EMBODIMENT

The invention will be described hereinunder in detail through a preferred embodiment.

Figure 1:
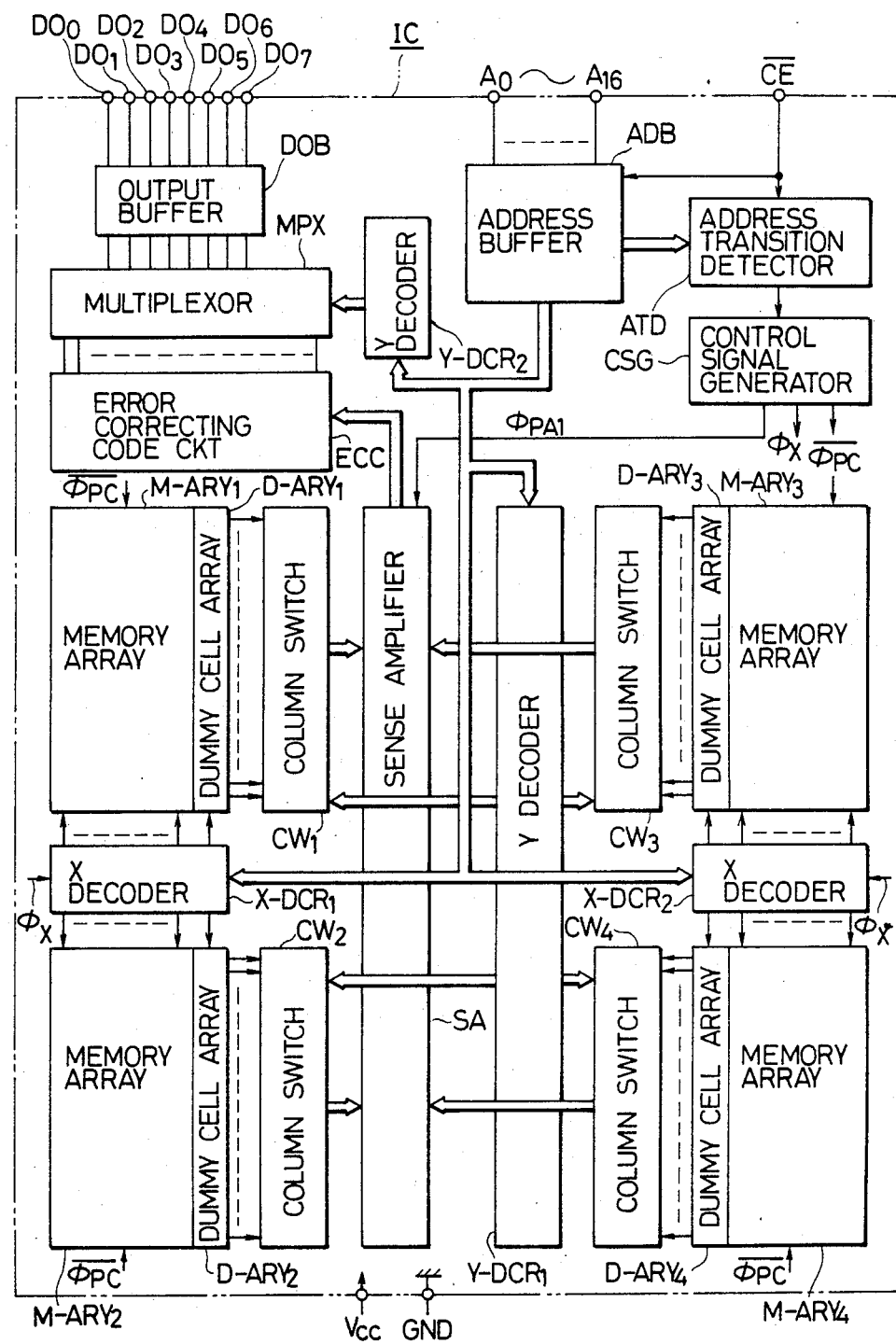
FIG. 1 is a circuit block diagram of a ROM in accordance with a preferred embodiment of the invention.

FIG. 1 is a block diagram of an example of a mask ROM to which the invention is applied.

Although not especially limitative, the mask ROM shown in FIG. 1 has four memory arrays M-ARY$_1$ to M-ARY$_4$ and has a memory capacity of about one megabits as a whole. Each of the memory arrays M-ARY$_1$ to M-ARY$_4$ has memory cells arranged in 512 rows by 608 columns. Accordingly, each of the memory arrays M-ARY$_1$ to M-ARY$_4$ has a memory capacity of 311,296 bits.

The circuit blocks shown in FIG. 1 are formed on a single semiconductor substrate by respective known semiconductor integrated circuit techniques. In addition, the arrangement of essential circuit blocks is drawn in FIG. 1 so as to practically correspond to the actual arrangement thereof on a semiconductor substrate.

Each of the memory arrays M-ARY$_1$ to M-ARY$_4$ is constituted by a dynamic circuit and includes a dummy cell array for forming a reference voltage in the readout operation.

An address buffer ADB for receiving external address signals $A_0$ to $A_{16}$ delivered from the outside is constituted by a static circuit and adapted to form internal address signals $a_0$, $\overline{a_0}$ to $a_{16}$, $\overline{a_{16}}$, each pair of the internal address signals being constituted by true and false levels. The address buffer ADB is adapted so that its operation is controlled by a chip selecting signal $\overline{CE}$ delivered from the outside, although not especially limitative thereto.

In the above-mentioned internal address signals $a_0$, $\overline{a_0}$ to $a_{16}$, $\overline{a_{16}}$, the internal address signals $a_0$, $\overline{a_0}$ to $a_9$, $\overline{a_9}$ are transmitted to X decoders X-DCR$_1$ and X-DCR$_2$. On the other hand, the internal address signals $a_{10}$ $\overline{a_{10}}$ to $a_{13}$, $\overline{a_{13}}$ and $a_{15}$, $\overline{a_{15}}$ to $a_{16}$, $\overline{a_{16}}$ are transmitted to Y decoders Y-DCR$_1$ and Y-DCR$_2$.

Each of the address decoders X-DCR$_1$, X-DCR$_2$, Y-DCR$_1$ and Y-DCR$_2$ is constituted by a static circuit, although not especially limitative thereto.

To row address selecting lines (word lines) in the memory arrays M-ARY$_1$ to M-ARY$_4$, $2^{10}(=1,024)$ kinds of word line selecting signals are applied which are formed in the X decoders (also serving as word line drivers) X-DCR$_1$ and X-DCR$_2$ that receive the internal address signals $a_0$, $\overline{a_0}$ to $a_9$, $\overline{a_9}$. In these signals, 512 kinds of word line selecting signals formed in the X decoder X-DCR$_1$ are applied to 512 word lines $W_0$ to $W_{511}$, respectively, in the memory arrays M-ARY$_1$ and M-ARY$_2$ on the left-hand side. On the other hand, the other 512 kinds of word line selecting signals formed in the X decoder X-DCR$_2$ are applied to 512 word lines $W_{512}$ to $W_{1023}$, respectively, in the memory arrays M-ARY$_3$ and M-ARY$_4$ on the right-hand side.

Moreover, in accordance with the internal address signals $a_9$, $\overline{a_9}$, which are the highest order bits, the X decoders X-DCR$_1$ and X-DCR$_2$ form dummy word line selecting signals for selecting dummy cells from dummy arrays D-ARY$_3$ and D-ARY$_4$ on the right-hand side when selecting memory cells from the memory arrays M-ARY$_1$ and M-ARY$_2$ on the left-hand side, and form dummy word line selecting signals for selecting dummy cells from dummy arrays D-ARY$_1$ and D-ARY$_2$ on the left-hand side when selecting memory cells from the memory arrays M-ARY$_3$ and M-ARY$_4$ on the right-hand side, to the contrary.

The Y decoder Y-DCR$_1$ receives the four-bit internal address signals $a_{10}$, $\overline{a_{10}}$ to $a_{13}$, $\overline{a_{13}}$ and forms 16 kinds of decoded signals. Each of the memory arrays M-ARY$_1$ to M-ARY$_4$ has 608 columns as mentioned above. Consequently, column switches CW$_1$ and CW$_4$ are controlled by the decoded signals formed in the address decoder Y-DCR$_1$ so that 38 columns are simultaneously selected from each memory array in response to one decoded signal. Thereby, the column switches CW$_1$ and CW$_2$ output signals delivered from a total of 76 memory cells (or dummy cells) in the memory arrays M-ARY$_1$ and M-ARY$_2$ on the left-hand side, while the column switches CW$_3$ and CW$_4$ output signals delivered from a total of 76 dummy cells (or memory cells) in the memory arrays M-ARY$_3$ and M-ARY$_4$ on the right-hand side.

A sense amplifier SA which receives the signals from the column switches CW$_1$ to CW$_4$ is constituted by a total of 76 dynamic differential amplifier circuits. The 76 dynamic differential amplifier circuits are divided into 38 sets each constituted by two dynamic differential amplifier circuits. The respective output signals of the two dynamic differential amplifier circuits of each set are made common to each other through respective transfer insulated-gate field-effect transistors (referred to as "MOSFET" hereinafter) and supplied to a circuit, not shown in FIG. 1, which is effectively a latching circuit having an data holding function. One of the differential amplifier circuits constituting one set and the transfer MOSFET corresponding thereto are adapted so that their operations are controlled by the internal address signal $a_{14}$, for example, while the operations of the other differential amplifier circuit and the corresponding transfer MOSFET are controlled by the internal address signal $\overline{a_{14}}$. Accordingly, in the readout operation of the ROM, either of the two differential amplifier circuits determined by the internal address signals $a_{14}$, $\overline{a_{14}}$ operates to supply its output to the circuit, not shown in FIG. 1, which operates as a latching circuit. Consequently, in the readout operation of the ROM, 38 output signals are delivered from the sense amplifier SA.

For example, in the case where 76 memory cells are selected from the memory arrays M-ARY$_1$ and M-ARY$_2$ on the left-hand side in response to the word line selecting signal delivered from the X decoder X-DCR$_1$ and 76 dummy cells are selected from the dummy cell arrays D-ARY$_3$ and D-ARY$_4$ on the right-hand side in response to the dummy word line selecting signal delivered from the X decoder X-DCR$_2$, the respective dynamic differential amplifier circuits receive signals delivered from the memory cells selected and signals delivered from the dummy cells selected correspondingly to these memory cells through the column switches CW$_1$ to CW$_4$. In these 76 dynamic differential amplifier circuits, 38 dynamic differential amplifier circuits selected by the internal address signals $a_{14}$, $\overline{a_{14}}$ operate. More specifically, each of the 38 differential amplifier circuits amplifies the potential difference between the signal supplied from the corresponding memory cell and the signal supplied from the dummy cell corresponding thereto. In other words, each of the 38 differential amplifier circuits compares the potential of the signal supplied from the corresponding selected memory cell and the reference voltage of the signal supplied from the dummy cell corresponding to the memory cell thereby to detect whether the data stored in the memory cell is a binary signal "1" or "0".

The 38-bit data detected in the sense amplifier SA is transferred to the ECC circuit through the circuit, not shown in FIG. 1, which is effectively a latching circuit. As will be described later with reference to FIGS. 2A and 2B, this latching circuit is constituted by 38 unit latching circuits. In addition, each unit latching circuit is constituted by a main amplifier and an inverter and effectively carries out a latching function. 32-bit data in the 38-bit data read out is defined as data signals, and the other six-bit data is defined as parity check bits. The ECC circuit corrects error data and outputs the corrected one in the case where the supplied 38-bit data has any error, i.e., data different from what has been written is supplied to the ECC circuit.

The ECC circuit is constituted by a static circuit although not especially limitative thereto. Moreover, in order to allow a static output signal to be delivered from the ECC circuit, the latching circuit is provided, as described above, which is adapted to receive the output signal from each dynamic differential amplifier circuit and forms a static output signal and also serves as a main amplifier.

The 32-bit data signals corrected for a possible error by the ECC circuit are transmitted to an output buffer DOB by a multiplexor MPX, eight bits by eight bits, in four stages. For such a time division operation, the external address signals $A_{15}$, $A_{16}$ are employed. More specifically, internal address signals $a_{15}$, $\bar{a}_{15}$ and $a_{16}$, $\bar{a}_{16}$ formed based on the respective external address signals $A_{15}$ and $A_{16}$ are supplied to the Y decoder Y-DCR$_2$. The Y decoder Y-DCR$_2$ decodes the supplied internal address signals to form four kinds of control signals. The multiplexor MPX is controlled by the four kinds of control signals. Therefore, by simply properly determining the level of each of the external address signals $A_{15}$ and $A_{16}$, it is possible to select a desired eight bits from the 32-bit data signals delivered from the ECC circuit and output the same in parallel. Moreover, by properly changing the external address signals $A_{15}$ and $A_{16}$, it is also possible to output all the 32-bit data signals, eight bits by eight bits, in four stages.

The output buffer DOB is constituted by a static circuit and has a tristate output function including a high-output impedance state, although not especially limitative thereto.

An address transition detector ATD for receiving address signals delivered from the address buffer ADB and a control signal generator CSG are provided in order to form control signals necessary for the operation of each of the dynamic memory arrays M-ARY$_1$ to M-ARY$_4$, the sense amplifier SA and the like, e.g., a timing signal for precharging and a timing signal for discharging. Although not especially limitative, the address transition detector ATD is adapted to detect the change in level of either one of the internal address signals $a_0$ to $a_{14}$ and the chip selecting signal $\overline{CE}$ and then form one trigger pulse. The control signal generator CSG is adapted to receive the trigger pulse and form various signals necessary for the readout operation of each of the memory arrays and the sense amplifier. In FIG. 1, the following signals are shown as representatives thereof: a timing signal $\overline{\phi_{PC}}$ for controlling the precharging and discharging of the memory arrays and the sense amplifier; a timing signal $\phi_X$ for regulating the word line selecting timing; and a timing signal $\phi_{PA1}$ for regulating the activating timing for the sense amplifier SA.

Although not especially limitative, the ROM shown in FIG. 1 can be employed as a circuit for generating Chinese character patterns in which one character pattern is constituted by 32×32 bits. Accordingly, the ROM is able to store up to 1,024 character patterns.

Essential circuit blocks of the ROM will be described hereinunder in detail through practical examples.

Figure 3:
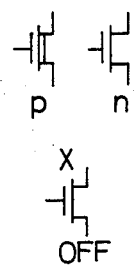
FIG. 3 illustrates circuit symbols employed in a MOSFET.

In the following description, circuit symbols drawn in the drawings will be used as illustrated in FIG. 3 in order to simplify the drawings. More specifically, in FIG. 3, the circuit symbol accompanied by a letter p denotes an enhancement-mode P-channel MOSFET; the circuit symbol accompanied by a letter n designates an enhancement-mode N-channel MOSFET; and a circuit symbol such as that accompanied by a mark X represents an enhancement-mode N-channel MOSFET adapted to have a threshold voltage made high so as to be in the OFF state at all times.

Figure 2A:
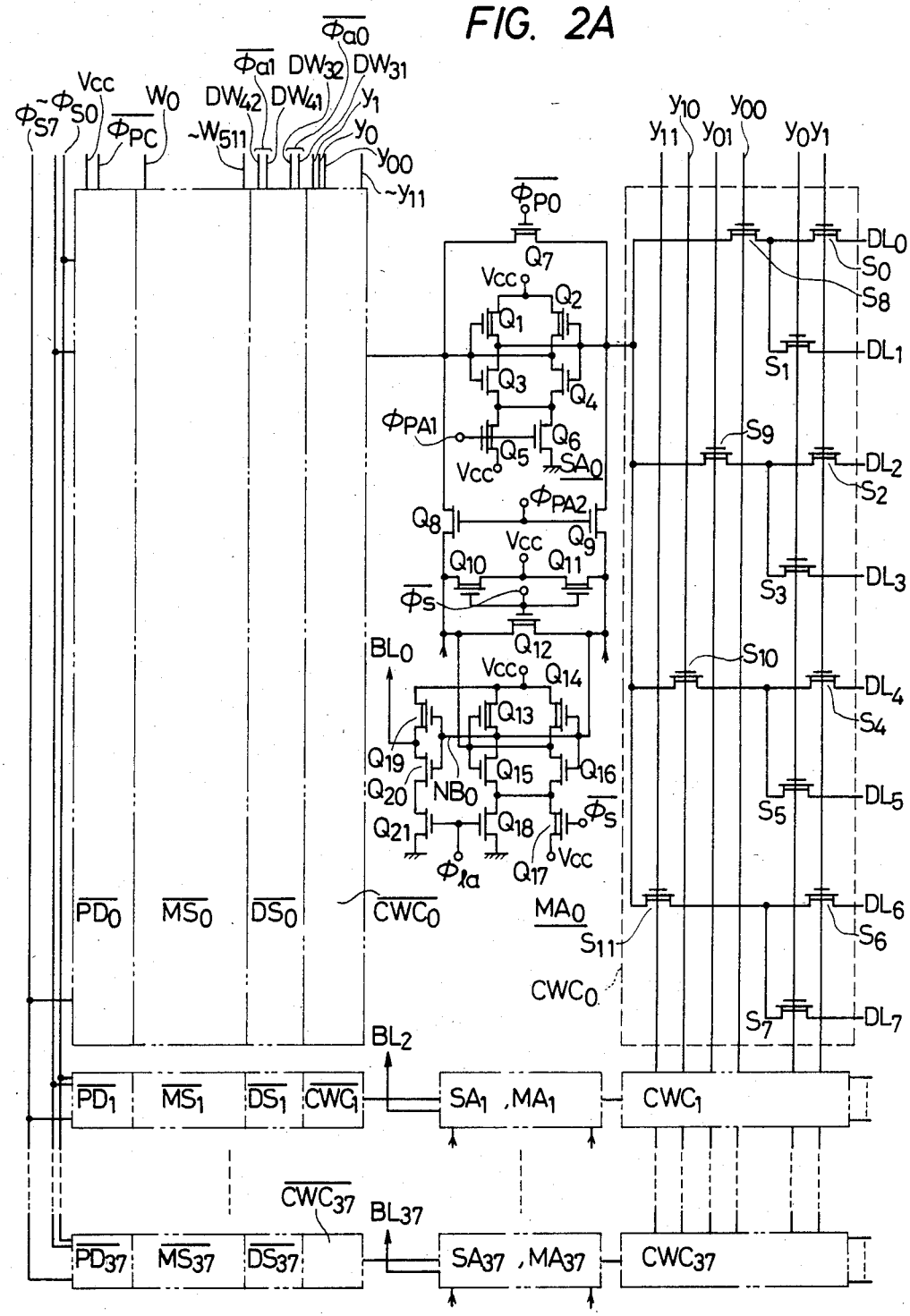
FIGS. 2A and 2B are practical circuit diagrams of circuit blocks M-ARY$_1$ to M-ARY$_4$, circuit blocks D-ARY$_1$ to D-ARY$_4$, circuit blocks CW$_1$ to CW$_4$ and a sense amplifier SA shown in FIG. 1.
Figure 2B:
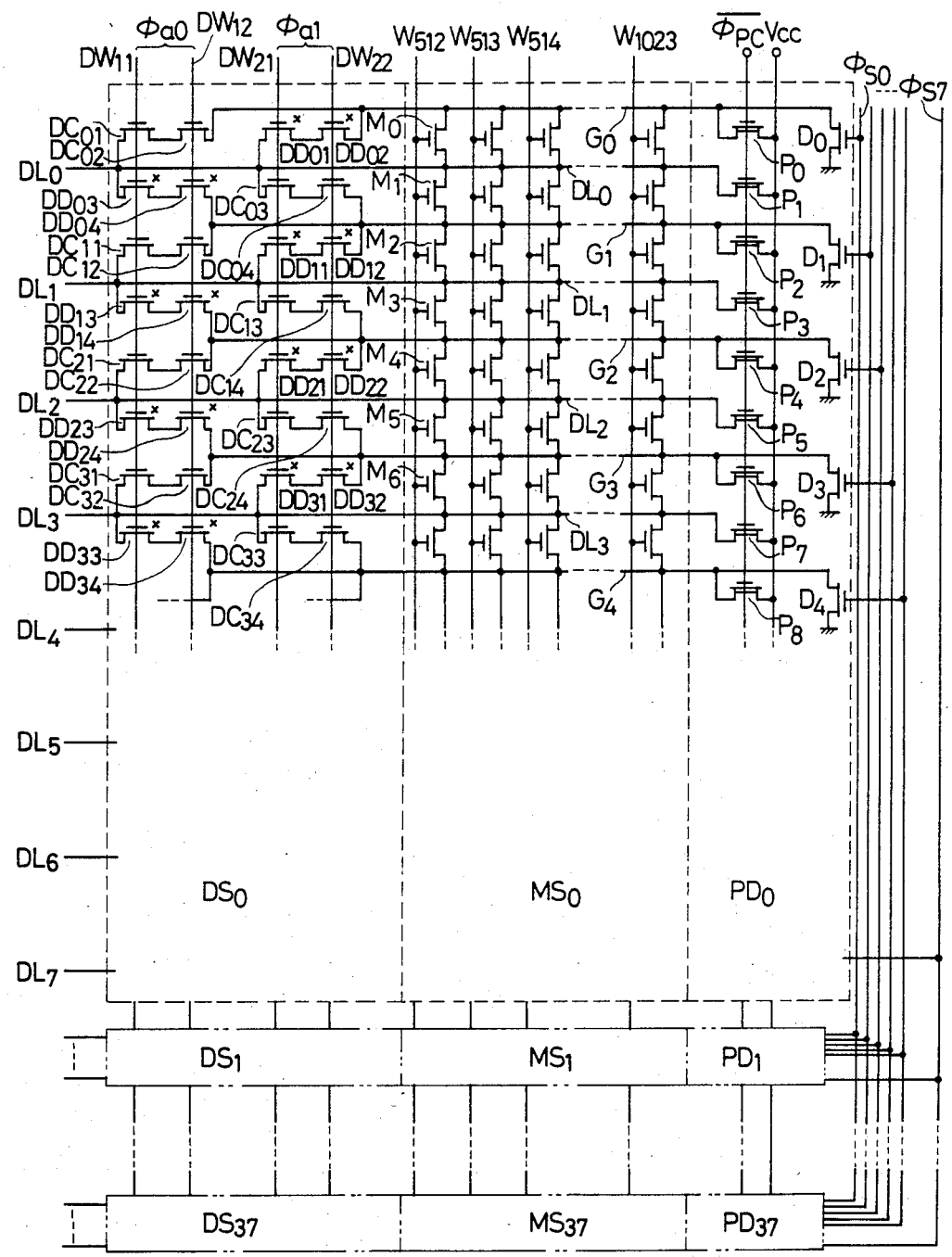

FIGS. 2A and 2B show practical circuits of the respective memory arrays M-ARY$_1$ to M-ARY$_4$ and sense amplifier SA shown in FIG. 1.

Although not especially limitative, each circuit is constituted by a CMOS (complementary MOS) circuit composed of a P-channel MOSFET and an N-channel MOSFET, as shown in FIGS. 2A and 2B.

FIGS. 2A and 2B shows practical circuits of the memory arrays arranged on the right-hand side of the sense amplifier SA in FIG. 1, for example, the memory arrays M-ARY$_3$ and M-ARY$_4$. Accordingly, 512 word lines, i.e., the word lines W$_{512}$ to W$_{1023}$, are formed from the top to the bottom as viewed in the Figure. These word lines are employed for the memory arrays M-ARY$_3$ and M-ARY$_4$ in common.

In the Figure, the memory arrays M-ARY$_1$ and M-ARY$_2$ shown by blocks have practically the same constructions as those of the memory arrays M-ARY$_3$ and M-ARY$_4$. Accordingly, similarly to the memory arrays M-ARY$_3$ and M-ARY$_4$, 512 word lines, i.e., the word lines W$_0$ to W$_{511}$, are formed in the left-hand side memory arrays M-ARY$_1$ and M-ARY$_2$ shown by blocks.

Moreover, as shown in the Figure, the memory arrays and the dummy arrays have ground lines G and data lines DL alternately arranged therein from the right to the left as viewed in the FIG. 2B. Although not especially limitative a ground line G$_0$ is formed as the first line, and a data line DL$_0$ is formed as the second line. Then, in the similar manner, the ground lines and the data lines are alternately arranged: a ground line G$_1$ is placed next to the data line DL$_0$, and a data line DL$_1$ is placed next to the ground line G$_1$.

Storage MOSFETs (memory cells) M$_0$ through M$_6$ and the like are formed at the respective intersections between the word lines and the data lines.

More specifically, each storage MOSFET is an N-channel device and has its gate connected to the corresponding word line and its drain connected to the corresponding data line and moreover its source connected to the corresponding ground line. Accordingly, except for the ground line G$_0$ at an end, for example, one data line DL$_0$ has the drains of different storage MOSFETs M$_0$ and M$_1$, on the same word line W$_{512}$, connected thereto in common, while the ground line $G_1$ has the sources of different storage MOSFETs $M_1$ and $M_2$, on the same word line $W_{512}$, connected thereto in common. Although not especially limitative, these ground lines and data lines are constructed of the semiconductor regions which are integrally formed with the semiconductor regions constituting the sources and drains of the memory MOSFETs, respectively. Thus, it becomes unnecessary to specially form contact regions for electrically connecting, for example, the data lines and the drains of the memory MOSFETs, respectively. Accordingly, it is possible to increase the integration degree of the memory arrays. Each of these memory MOSFETs has its threshold voltage predetermined in response to the information "1" or "0".

As shown in the Figure, eight data lines are connected to one input/output terminal of a single dynamic differential amplifier circuit through a plurality of switching MOSFETs. Therefore, it can be considered that a single unit memory array is constituted by a plurality of memory cells connected to the eight data lines, a plurality of precharging MOSFETs, described later, provided in relation to the eight data lines, and a plurality of discharging MOSFETs. It can be also considered that in correspondence to the unit memory array, a single unit dummy cell array is constituted by a plurality of dummy cells connected to the eight data lines. Moreover, it can be considered that a unit column switch is constituted by a plurality of switching MOSFETs provided between the eight data lines and the dynamic differential amplifier circuit.

Each data line is mutually used by the memory cells formed on the upper side (as viewed in the Figure) thereof and the memory cells formed on the lower side thereof. Accordingly, a single memory array has 304 data lines. In consequence, a single memory array is constituted by 38 unit memory arrays and 38 unit dummy cell arrays. In correspondence thereto, a single column switch is constituted by 38 unit column switches. Therefore, the memory arrays M-ARY$_1$ to M-ARY$_4$ are constituted by 152 unit memory arrays and 152 unit dummy cell arrays. The column swiches CW$_1$ and CW$_4$ are constituted by 152 unit column switches.

The unit memory arrays have substantially the same construction, also the unit dummy cell arrays have substantially the same construction, and moreover, the unit column switches have substantially the same construction.

Each dynamic differential amplifier circuit is, as shown in the Figure, provided between a unit column switch CWC$_0$, a unit dummy cell array DS$_0$ and a unit memory array MS$_0$ on one side and a unit column switch $\overline{CWC_0}$, a unit dummy cell array $\overline{DS_0}$ and a unit memory array $\overline{MS_0}$ which correspond to the former switch and arrays respectively on the other side. Since there are 76 dynamic differential amplifier circuits as described above, there are 76 sets each formed as described above.

To simplify the drawing, FIGS. 2A and 2B shows only 38 sets in the 76 sets: namely, 38 dynamic differential amplifier circuits, the operation of which are controlled by the internal address signal $a_{14}$; 76 unit column switches CWC$_0$ to CWC$_{37}$ and $\overline{CWC_0}$ to $\overline{CWC_{37}}$ connected to the input/output terminals of the dynamic differential amplifier circuits; 76 unit memory arrays MS$_0$ to MS$_{37}$ and $\overline{MS_0}$ to $\overline{MS_{37}}$; and 76 unit dummy cell arrays DS$_1$ to DS$_{37}$ and $\overline{DS_0}$ to $\overline{DS_{37}}$.

In the Figure, reference symbols PD$_0$ to PD$_{37}$ and $\overline{PD_0}$ to $\overline{PD_{37}}$ denote precharging and discharging circuits respectively. Each precharging and discharging circuit is constituted by a plurality of precharging MOSFETs and a plurality of discharging MOSFETs provided in relation to the eight data lines.

The eight data lines DL$_0$ to DL$_7$ are made common to each other through P-channel MOSFETs S$_0$ to S$_{11}$ constituting a unit column switch and are connected to one input terminal of the unit sense amplifier SA$_0$. The unit column switch is constituted by a series-circuit composed of the MOSFETs S$_8$ to S$_{11}$ adapted to select four data lines and the MOSFETs S$_0$ to S$_7$ adapted to select two data lines for each. In other words, the unit column switch is constituted by a plurality of tree-like circuits. For example, if the MOSFETs S$_8$ and S$_0$ are turned ON, then the data line DL$_0$ is selected. Thus, the column switches have a function to decode column addresses. Thereby, it is possible to reduce the number of wirings required for connecting the address buffer ADB and the address decoder Y-DCR$_1$, so that the IC chip can be arranged to be smaller.

Each of the ground lines and the data lines is provided with a precharging MOSFET for receiving the precharging signal $\phi_{PC}$ delivered from the control signal generator CSG in order to precharge the stray and parasitic capacitances connected thereto. More specifically, as shown in the Figure on behalf of the precharging MOSFETs, precharging P-channel MOSFETs P$_0$ to P$_8$ for receiving the precharging signal $\overline{\phi_{PC}}$ are provided between the respective ground and data lines and the power source voltage V$_{CC}$.

Moreover, a discharging MOSFET is provided between each ground line and the ground potential point of the circuit. More specifically, discharging N-channel MOSFETs D$_0$ to D$_4$ are provided between the ground lines G$_0$ to G$_4$, shown as representatives, and the ground potential, respectively. To the gates of the respective discharging MOSFETs D$_0$ to D$_4$ and the like, ⅛ selecting signals $\phi_{S0}$ to $\phi_{S7}$ formed by decoding the column address signals are applied in synchronism with the timing signal $\phi_S$, respectively.

The timing signal $\phi_S$ is formed in the control signal generator CSG shown in FIG. 1.

The plurality of precharging MOSFETs and plurality of discharging MOSFETs constitute the above-described precharging and discharging circuit PDS$_0$.

When the timing signal $\phi_S$ is brought into the high level state from the low level state, the ⅛ selecting signals S$_0$ to S$_7$ are applied to the corresponding discharging N-channel MOSFETs. At this time, in the eight selecting signals S$_0$ to S$_7$, only one selecting signal corresponding to the column address signals is made high in level, for example, and the other seven selecting signals are made low in level.

Consequently, one discharging MOSFET is selected from the discharging MOSFETs D$_0$ to D$_8$ in each of the precharging and discharging circuits PD$_0$ to PD$_{37}$ and $\overline{PD_0}$ to $\overline{PD_{37}}$ and is turned ON. At this time, the other discharging MOSFETs are made to remain OFF.

The following is a description of the memory cell selecting operation.

By way of example, the selection of the memory cell M$_1$ will be described hereinunder.

After each of the data and ground lines is precharged, the output signal delivered from the Y decoder Y-DCR$_1$ causes the MOSFETs S$_0$ and S$_8$ to turn ON and other MOSFETs S$_1$, S$_3$, S$_5$, S$_7$ and S$_9$ to S$_{11}$ to turn OFF. On the other hand, the selecting signal $S_1$ causes the discharging MOSFET $D_1$ to turn ON and the other discharging MOSFETs to turn OFF. Consequently, one input node of the unit sense amplifier $SA_0$ and the data line $DL_0$ are electrically connected together. Moreover, the electric charge stored in the stray and parasitic capacitances connected to the ground line $G_1$ is discharged through the discharging MOSFET $D_1$. Thus, the ground line $G_1$ is selected, and the potential thereof is brought to the ground potential of the circuit.

In the ROM in accordance with the embodiment, one data line, e.g., the data line $DL_1$, is mutually used by the memory cells formed on the upper side thereof and the memory cells formed on the lower side thereof.

In the case where one of the memory cells formed on the lower side of data line $DL_0$, i.e., one of the memory cells provided between the data line $DL_0$ and the ground line $G_1$ is selected, the discharging MOSFET $D_1$ is turned ON by the selecting signal $\phi_{S1}$, and the ground line $G_1$ is selected. Thereby, the plurality of memory cells provided between the data line $DL_0$ and the ground line $G_1$ are made selectable. When the desired word line $W_{512}$ is brought to a selection level, e.g., the high level, by the output signal from the X decoder X-DCR$_2$, the memory cell $M_1$ is selected from the plurality of memory cells on the lower side of the data line $DL_0$. The potential of the data line $DL_0$ changes in accordance with the data stored in the selected memory cell $M_1$. Thus, a signal in accordance with the data stored in the selected memory cell $M_1$ is transmitted to one input/output terminal of the sense amplifier $SA_0$.

In the case where one of the memory cells formed on the upper side of the data line $DL_0$, i.e., one of the memory cells formed between the data line $DL_0$ and the ground line $G_0$, e.g., the memory cell $M_0$, is selected, the discharging MOSFET $D_0$ is turned ON by the selecting signal $\phi_{S0}$ and the ground line $G_0$ is selected, thereby allowing the memory cell $M_0$ to be selected in the same manner as in the case described above.

In the ROM in accordance with the embodiment, two MOSFETs constituting a dummy cell are provided in series between each data line and the corresponding ground line.

More specifically, with respect to the data line $DL_0$, MOSFETs $DC_{01}$ and $DC_{02}$ constituting a dummy cell are provided between the data line $DL_0$ and one ground line $G_0$ corresponding thereto, and MOSFETs $DC_{03}$ and $DC_{04}$ constituting a dummy cell are provided between the data line $DL_0$ and the other ground line $G_1$ corresponding thereto.

Series MOSFETs constituting a dummy cell, e.g., the MOSFETs $DC_{01}$ and $DC_{02}$, are MOSFETs having the same size as the memory MOSFETs and are formed simultaneously with the memory MOSFETs having a low threshold voltage. Moreover, these MOSFETs have the same construction.

The following is a description of the dummy cell selecting operation. In selection of a dummy cell, the following signals are employed: the highest order address signal $A_9$ in the external row address signals, and the lowest order signal $A_{10}$ in the column address signals used in forming the selecting signals $\phi_{S0}$ through $\phi_{S7}$, as described hereinbefore. More specifically, the highest order external address signal $A_9$ is used to determine whether a dummy cell should be selected from the dummy arrays on the right-hand side or left-hand side. The lowest order external address signal $A_{10}$ is used to determine whether a dummy cell should be selected from the dummy arrays formed on the upper side or lower side of a data line. The lowest order external address signal $A_{10}$, in the selecting signals $\phi_{S0}$ through $\phi_{S7}$, is an address signal to determine whether the discharging MOSFETs connected to the ground line on the upper side of a data line should be turned ON or the discharging MOSFETs connected to the ground line on the lower side of the data line should be turned ON.

In practice, the above-mentioned two address signals and the word line selecting timing signal $\phi_X$ are decoded to form four kinds of dummy word line driving signals $\phi_{a0}$, $\phi_{al}$, $\overline{\phi_{a0}}$, $\overline{\phi_{al}}$.

The following is a description of the selecting operation of a dummy cell constituted by the MOSFETs $DC_{03}$ and $DC_{04}$.

Each of the data and ground lines is precharged in the same manner as in the case of the above-described memory cell selecting operation. The MOSFETs $S_0$ and $S_8$ are turned ON by the output signal from the Y decoder Y-DCR$_1$, and the discharging MOSFET $D_1$ is turned ON by the selecting signal $\phi_{S1}$ to select the ground line $G_1$. Thereby, the data line $DL_0$ is electrically connected to the input terminal of the unit sense amplifier $SA_0$, and the potential of the ground line $G_1$ is brought to the ground potential of the circuit. When the selecting signal $\phi_{al}$ is brought to a selection level, e.g., the high level, in order to select the above-mentioned dummy cell, the MOSFETs $DC_{03}$ and $DC_{04}$ are turned ON.

As described hereinbefore, each of the MOSFETs constituting a dummy cell is a MOSFET having the same size as the memory MOSFETs and formed simultaneously with the memory MOSFETs having a low threshold voltage and moreover has the same construction as those MOSFETs. Thus, the conductance of a dummy cell measured when it is selected, i.e., the combined conductance of the MOSFETS $DC_{03}$ and $DC_{04}$ in the ON state, is a value substantially half the conductance of a memory MOSFET adapted to have a low threshold voltage measured when it is selected. A memory MOSFET adapted to have a high threshold voltage remains substantially OFF whether it is being selected or not. Accordingly, the conductance of the dummy cell is larger than the conductance of the memory MOSFET adapted to have a high threshold voltage measured when it is selected. In other words, the conductance of the dummy cell is an intermediate value between the conductance of the memory MOSFET having a low threshold voltage and that of the memory MOSFET having a high threshold voltage.

The electric charge stored in the stray and parasitic capacitances of the data line by precharging is discharged in accordance with the conductance of the selected dummy cell. In other words, the potential of the data line $DL_1$ gradually lowers in accordance with the conductance of the dummy cell.

Accordingly, the potential of a data line measure when a dummy cell connected thereto is selected is an intermediate value between the potential of a data line measured when a memory MOSFET having a low threshold voltage and connected thereto is selected and the potential of the data line measured when a memory MOSFET having a high threshold voltage and connected thereto is selected.

In the readout operation, when a memory cell is selected from, for example, the unit memory array $MS_0$ on the right-hand side of the unit sense amplifier $SA_0$, the dummy cell corresponding to the above-mentioned memory cell is selected from the unit dummy cell array $\overline{DS_0}$ on the left-hand side of the unit sense amplifier $SA_0$. For instance, when the memory cell $M_1$ is selected from the unit memory array $MS_0$, a dummy cell connected to the data line $DL_0$ corresponding to the data line $\overline{DL_0}$ is selected in the unit dummy cell arrays $\overline{DS_0}$ on the left-hand side of the unit sense amplifier $SA_0$. More specifically, in the unit dummy cell array $\overline{DS_0}$ on the left-hand side of the unit sense amplifier $SA_0$, a dummy cell is selected which is provided between the ground line connected with the discharging MOSFETs adapted to turn ON in response to the selecting signal $\phi_{S0}$ and the data line $\overline{DL_0}$.

The potential of the data line $DL_0$ becomes a value in accordance with the data stored in the selected memory cell and is transmitted to one input terminal of the unit sense amplifier $SA_0$. On the other hand, the potential of the data line $\overline{DL_0}$ becomes a value in accordance with the conductance of the selected dummy cell, i.e., the reference potential, and is transmitted to the other input terminal of the unit sense amplifier $SA_0$.

In the ROM in accordance with the embodiment, a compensating circuit is provided to each dummy word line in order to prevent malfunction.

Although not especially limitative, in the embodiment, the compensating circuit is constituted by two MOSFETs adapted to have a high threshold voltage. More specifically, two MOSFETs are series-connected between a data line and the corresponding ground line, and the gate of each MOSFET is connected to the corresponding dummy word line. With respect to the data line $DL_0$, MOSFETs $DD_{01}$ and $DD_{02}$ having a high threshold voltage and constituting a compensating circuit are series-connected between the data line $DL_0$ and one ground line $G_0$ corresponding thereto, and MOSFETs $DD_{03}$ and $DD_{04}$ having a high threshold voltage and constituting a compensating circuit are series-connected between the data line $DL_0$ and the other ground line $G_1$ corresponding thereto.

The other data lines and the data lines on the left-hand side of the sense amplifier $SA_0$ are similarly provided with respective compensating circuits. Each of the MOSFETs constituting a compensating circuit is adpated to have a high threshold voltage as mentioned above so that the MOSFET will not be turned ON even if a selecting signal is applied to the dummy word line connected to the gate thereof. The MOSFETs constituting each compensating circuit are formed simultaneously with the memory MOSFETs.

As shown in the Figure, the dummy cells provided on the upper side of a data line are connected to the dummy word line to which the compensating circuits provided on the lower side of the data line are connected, while the dummy cells provided on the lower side of a data line are connected to the dummy word line to which the compensating circuits provided on the upper side of the data line are connected.

More specifically, with respect to the data line $DL_0$, the gate electrodes of the respective MOSFETs $DC_{01}$ and $DC_{02}$ constituting a dummy cell are connected to their corresponding dummy word lines $DW_{11}$ and $DW_{12}$ respectively, and the gate electrodes of the respective MOSFETs $DD_{03}$ and $DD_{04}$ constituting a compensating circuit are also connected to their corresponding dummy word lines $DW_{11}$ and $DW_{12}$. In the same manner, the gate electrodes of the respective MOSFETs $DC_{03}$ and $DC_{04}$ constituting a dummy cell and those of the MOSFETs $DD_{01}$ and $DD_{02}$ constituting a compensating circuit are connected to their corresponding dummy word lines $DW_{21}$ and $DW_{22}$.

Thus, between a data line and the ground line corresponding thereto, one MOSFET is connected to one dummy word line in the same manner as one word line. Accordingly, the total number of the MOSFETs connected to one word line equals that of the MOSFETs connected to one dummy word line. These MOSFETs are formed simultaneously. Thereby, these MOSFETs have gate insulating films equal to each other in film thickness, dielectric constant, etc. Moreover, these MOSFETs have substantially the same overlapping amount between each gate electrode and the corresponding source region and that between each gate electrode and the corresponding drain region. Consequently, these MOSFETs have substantially the same value in the MOSFET capacitance comprising the capacitance formed between each gate electrode and the corresponding source region, the capacitance formed between each gate electrode and the corresponding drain region, and other capacitances. Therefore, equalizing the total number of MOSFETs connected permits the value of capacitances connected to a dummy word line and that of capacitances connected to a word line to be substantially equal to each other. More specifically, it is possible to make the value of the capacitance of a dummy word line constituted by the capacitances of the respective MOSFETs connected thereto and that of the capacitance of a word line constituted by the capacitances of the respective MOSFETs similarly connected thereto substantially equal to each other. In other words, it is possible to make the value of the capacitance of a dummy word line which is to be load capacitance with respect to the X decoder (driver) and that of the capacitance of a word line which is to be a load capacitance with respect to the X decoder (driver) substantially equal to each other. When applying an output signal to a word line, the X decoder applies an output signal to the corresponding dummy word line substantially simultaneously.

Accordingly, it is possible to make the change in potential of a word line when it is rising to the selection level in response to the output signal from the X decoder and the change in potential of the corresponding dummy word line when it is rising to the selection level in response to the output signal from the X decoder substantially equal to each other. More specifically, it is possible to make the voltage applied to the gate of the memory MOSFET to be selected and the voltage applied to the gate of the MOSFET of the dummy cell to be selected substantially equal to each other at all times. Consequently, the conductance of the selected dummy cell constantly becomes an intermediate value between the conductance of the selected memory MOSFET having a low threshold voltage and the conductance of the selected memory MOSFET having a high threshold voltage. In other words, in the readout operation of the ROM, the potential of a data line measured when a dummy cell connected thereto is selected will never be lower than the potential of a data line measured when a memory MOSFET having a low threshold voltage and connected thereto is selected or higher than the potential of a data line measured when a memory MOSFET having a high threshold voltage and connected thereto is selected. Accordingly, it is possible to prevent malfunction.

The above-described discharging MOSFETs $D_0$ to $D_4$ and the like prevent the generation of a current wastefully consumed, by prohibiting discharging of the capacitances of the respective data and ground lines not selected. The size of each of these MOSFETs $D_0$ to $D_4$ and the like is set so that the conductance of the MOSFET measured when it is ON is sufficiently larger than that of a memory MOSFET measured when it is ON.

Thereby, the time constant in discharging the electric charge stored in the stray or parasitic capacitance connected to a data line is determined practically by the capacitances and the conductance of a storage MOSFET measured when it is in the selected state, or practically by the capacitances and the conductance of a dummy cell measured when it is in the selected state, i.e, the combined conductance of the two MOSFETs connected in series.

The MOSFETs constituting each dummy cell are formed simultaneously with the memory MOSFETs. Therefore, the ROM manufacturing process will not increase in number of steps. Moreover, by the simultaneous formation, if there should be any change in characteristics, e.g., conductance, of the memory MOSFETs owing to manufacturing condition variations or the like, the MOSFETs constituting the dummy cells have the same change in their characteristics. Therefore, it is possible to make the conductance of each dummy cell substantially half the conductance of a memory MOSFET having a low threshold voltage which turns ON when selected, independently of the manufacturing condition variations or the like. Accordingly, it is possible to manufacture a memory with a high production yield.

The writing of data into each memory MOSFET is effected by implanting impurity ions into a region for forming the channel of the memory MOSFET, although not especially limitative thereto. More specifically, the threshold voltage of a memory MOSFET is determined by the impurity ion implantation. For example, into a region for forming the channel of a memory MOSFET required to have a high threshold voltage, impurity ions having a conductivity type opposite to that of the channel are implanted. The region for forming the channel of a memory MOSFET required to have a low threshold voltage is not subjected to the ion implantation for shifting the threshold voltage. As a result, it is possible to write a binary signal "1" or "0" into a memory MOSFET. In this case, although not especially limitative, the threshold voltage of a memory MOSFET determined by the ion implantation is made to correspond to the binary signal "1", while the low threshold voltage of a storage MOSFET not subjected to the ion implantation is made to correspond to the binary signal "0".

The readout operation is effected by detecting whether a memory MOSFET selected is practically turned ON or OFF by the voltage applied between the gate and source thereof. In other words, the readout operation corresponds to the detection of whether the conductance of the selected memory MOSFET is large or small. The reference used for the detection of the size of the conductance is given by the dummy cell.

An example of a method of manufacturing MOSFETs used in the ROM in accordance with the embodiment will be described hereinunder.

A gate insulating film is formed on a semiconductor substrate (or well region), and a polycrystalline silicon layer is formed thereon. Then, the polycrystalline silicon layer is etched so as to form a gate electrode. With the polycrystalline silicon layer constituting the gate electrode used as a mask, a source region and a drain region are formed on the semiconductor substrate (or well region). More specifically, the source and drain regions are formed in a self-aligning manner using as a mask the polycrystalline silicon layer constituting the gate electrode.

A heat treatment is carried out in order to form an interlayer insulating film and the like. The heat treatment undesirably causes diffusion of the source and drain regions formed on the semiconductor substrate (or well region). Thereby, the gate electrode and the source region, and the gate electrode and the drain region are undersirably overlapped with each other, respectively. Consequently, the MOSFET has capacitances such as the capacitance formed between the gate electrode and the source region and that formed between the gate electrode and the drain region.

The memory MOSFETs, the MOSFETs constituting the dummy cells and the MOSFETs constituting the compensating circuits are simultaneously formed by such a manufacturing method as described above. Moreover, if necessary, the channel forming region of the MOSFET is subjected to the ion implantation for shifting the threshold voltage as described above.

The unit sense amplifier $SA_0$ is constituted by a single dynamic differential amplifier circuit for receiving a signal delivered from the unit memory array $MS_0$ or $\overline{MS_0}$ and a reference signal delivered from the unit dummy cell array $\overline{DS_0}$ or $DS_0$.

The dynamic differential amplifier circuit is constituted by P-channel MOSFETs $Q_1$, $Q_2$, $Q_5$ and N-channel MOSFETs $Q_3$, $Q_4$, $Q_6$. More specifically, a latching circuit is constituted by two CMOS inverters each composed of the P-channel MOSFET $Q_1$ ($Q_2$) and the N-channel MOSFET $Q_3$ ($Q_4$), and the N-channel MOSFET $Q_6$ as a power switch is provided between the sources of the MOSFET $Q_3$ and $Q_4$ on one hand and the ground potential point of the circuit on the other to form a dynamic circuit. As will be described later in detail, in order to precharge, in a short period of time, the stray or parasitic capacitance connected to a data line, precharging of a data line is also effected from the unit sense amplifier side. For this purpose, the unit sense amplifier is provided with the P-channel MOSFET $Q_5$. More specifically, the P-channel MOSFET $Q_5$ is provided between the electrodes of the respective MOSFETs $Q_3$ and $Q_4$ serving as sources in the ordinary operating state on one hand and the supply voltage $V_{CC}$ on the other. A timing signal formed on the basis of the timing signal $\phi_{PA1}$ for controlling the operation of the sense amplifier and the internal address signal $a_{14}$ is applied to the gates of the respective MOSFETs $Q_5$ and $Q_6$. Although not especially limitative, the signal applied is a timing signal formed by ANDing the timing signal $\phi_{PA1}$ and the internal address signal $a_{14}$.

The output signal from the unit sense amplifier $SA_0$ is transmitted to the input/output terminal of the main amplifier in the unit latching circuit $MA_0$ via the transfer N-channel MOSFETs $Q_8$ and $Q_9$. A timing signal based on a timing signal $\phi_{PA2}$ and the internal address signal $a_{14}$ is applied to the gates of the respective transfer MOSFETs $Q_8$ and $Q_9$. Although not especially limitative, a timing signal formed by ANDing the timing signal $\phi_{PA2}$ and the internal address signal $a_{14}$ is applied to the gates of the respective transfer MOSFETs $Q_8$ and $Q_9$.

One unit sense amplifier, not shown, is supplied with a timing signal based on the timing signal $\phi_{PA1}$ and the internal address signal $a_{14}$, and the output signal therefrom is transmitted to the input/output terminal of the main amplifier in the unit latching circuit $MA_0$ via a pair of transfer MOSFETs, not shown. The timing signal based on the timing signal $\phi_{PA2}$ and the internal address signal $a_{14}$ is applied to the gates of the pair of transfer MOSFETs.

Thus, in the two unit sense amplifiers, only the unit sense amplifier selected by the external address signal $A_{14}$ is supplied with the timing signal $\phi_{PA1}$ for activating the sense amplifier. In addition, only the output signal of this selected unit sense amplifier is transmitted to the main amplifier via the transfer MOSFETs controlled by the timing signal $\phi_{PA2}$. More specifically, in the two unit sense amplifiers, only the unit sense amplifier selected by the external address signal $A_{14}$ operates, and the output signal therefrom is supplied to the main amplifier. Therefore, in the 76 units sense amplifiers, only 38 unit sense amplifiers operate in the readout operation. Accordingly, there are provided only 38 unit latching circuits each including a main amplifier.

In order to simplify the drawings and facilitate the description, it is assumed that each unit sense amplifier is supplied with the timing signal $\phi_{PA1}$, and the transfer MOSFETs provided between the unit sense amplifier and the main amplifier are supplied with the timing signal $\phi_{PA2}$. In other words, shown in the Figure is an imaginary state where the unit sense amplifier and the transfer MOSFETs have been selected by the external address signal $A_{14}$. In addition, the following description will be set forth on the assumption that this imaginary state is maintained.

Figure 6:
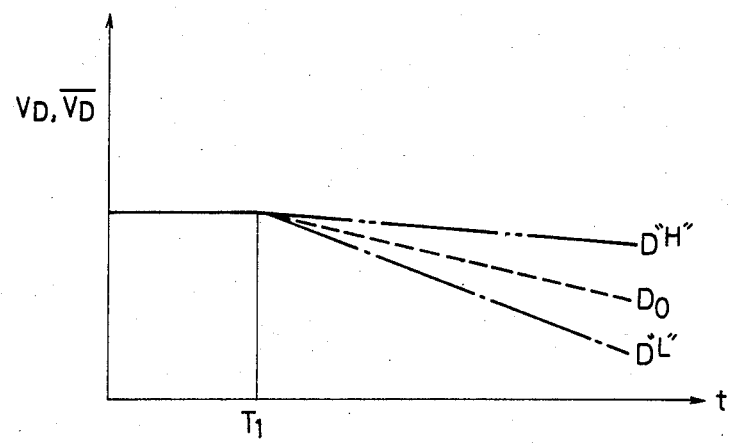
FIG. 6 is a waveform chart showing the operations of the circuit shown in FIGS. 2A and 2B.

FIG. 6 shows the changes with time of the potentials $V_D$ and $\overline{V_D}$ of the pair of data lines $DL_0$ and $\overline{DL_0}$ selected from the unit memory array $MS_0$ and the unit dummy cell array $\overline{DS_0}$ shown in FIGS. 2A and 2B.

In the Figure, a broken line represents the change in potential of the data line $\overline{DL_0}$ connected with the dummy cells. On the other hand, a one-dot-and-dash line represents the change in potential of the data line $DL_0$ when data "0" is being written into a memory MOSFET, while a two-dot-and-dash line represents the change in potential of the data line $DL_0$ when data "1" is being written into a memory MOSFET.

Each memory MOSFET has such a conductance as determined in accordance with the data stored therein as described hereinbefore. Therefore, the electric charge in the data line $DL_0$ precharged beforehand is started to be discharged in accordance with the data stored in a memory MOSFET when the same is selected.

A dummy cell selected simultaneously with the selection of the coresponding memory MOSFET has, as described hereinbefore, an intermediate conductance between the conductance of a memory MOSFET storing data "1" and that of a memory MOSFET storing data "0". Therefore, the electric charge in the data line $\overline{DL_0}$ precharged beforehand starts to be discharged in accordance with the conductance of a dummy cell when the same is selected.

Accordingly, the potentials of the respective data lines $DL_0$ and $\overline{DL_0}$ change as shown in the Figure.

The unit sense amplifier $SA_0$ amplifies the voltage difference between the pair of data lines and transmits the amplified voltage difference to the main amplifier in the unit latching circuit $MA_0$.

As shown in FIGS. 2A and 2B, the P-channel MOSFET $Q_7$ for short-circuiting is provided between a pair of input/output terminals of the unit sense amplifier. The short-circuiting MOSFET $Q_7$ is held ON while the data line is being precharged, by the timing signal $\overline{\phi_{PC}}$. As will be described later in detail with reference to FIG. 7, the MOSFETs constituting each unit column switch are all held ON during the precharging period by output signals $y_0$, $y_1$, and $y_{00}$ to $y_{11}$ delivered from the Y decoder $Y\text{-}DCR_2$. Accordingly, the following data lines are electrically connected to each other: a data line connecting one input/output terminal of the unit sense amplifier and the unit column switch $CWC_0$, i.e., a common data line; a common data line connecting the other input/output terminal of the unit sense amplifier and the unit column switch $\overline{CWC_0}$; each of the data lines formed in the unit memory array $MS_0$ and the unit dummy cell array $DS_0$; and each of the data lines formed in the unit memory array $\overline{MS_0}$ and the unit dummy cell array $\overline{DS_0}$. Therefore, the potentials of the respective data and common data lines precharged can be made substantially equal to each other. As a result, it is possible to improve the operating speed of the ROM.

In the case where the data line $DL_0$ formed on the right-hand side of the unit sense amplifier $SA_0$ and the data line $\overline{DL_0}$ formed on the left-hand side thereof are made different in potential from each other by the precharging operation, for example, when the potential of the data line $DL_0$ is made higher than that of the data line $\overline{DL_0}$ by the precharging operation, the readout operation of the ROM is retarded as follows.

For instance, in the case where a memory MOSFET is selected which stores data "1" and has its drain connected to the data line $DL_0$, the potential of the data line $DL_0$ starts to lower from a value higher than the potential of the data line $\overline{DL_0}$. In consequence, a relatively long time is required until the potential of the data line $DL_0$ becomes lower than the potential of the data line $\overline{DL_0}$ having the selected dummy cell connected thereto. Accordingly, in order to accurately read out data from a memory MOSFET, it is necessary to set a relatively long time from the time when the memory MOSFET and the corresponding dummy cell are selected until the corresponding unit sense amplifier is actuated. As a result, the operating speed of the ROM is retarded.

Provision of the short-circuiting MOSFETs as in the case of the embodiment, however, permits the potentials of the precharged pair of data lines $DL_0$ and $\overline{DL_0}$ to be substantially equal to each other. Consequently, when a memory MOSFET and the corresponding dummy cell are selected, the potential of the data line $DL_0$ and that of the data line $\overline{DL_0}$ change from substantially the same value. More specifically, from the time when the selection is made, the potential of the data line $DL_0$ is a value higher or lower than the potential of the data line $\overline{DL_0}$ in accordance with the data stored in the memory MOSFET. Accordingly, it is possible to accurately read out data even if the unit sense amplifier is actuated in a short period of time after the selection of the memory MOSFET and the corresponding dummy cell. As a result, it is possible to improve the operating speed of the ROM.

The unit sense amplifier $SA_0$ has a relatively high sensitivity, since it is constituted by a differential amplifier circuit. Accordingly, if the unit sense amplifier is actuated when the potential difference between the data lines $DL_0$ and $\overline{DL_0}$ is relatively small, the unit sense amplifier is able to amplify the potential difference without any malfunction. In other words, it is possible to actuate the unit sense amplifier in a relatively short period of time after the selection of the memory cell and the corresponding dummy cell, so that the readout operation of the ROM can be made higher in speed.

The following advantage is offered by, as in the case of the embodiment, constituting each unit sense amplifier by a differential amplifier circuit and arranging such that when, for example, word lines in the memory arrays M-ARY$_3$ and M-ARY$_4$ on the right-hand side as viewed in FIG. 1 are selected, the corresponding dummy word lines in the dummy arrays D-ARY$_1$ and D-ARY$_2$ on the left-hand side are simultaneously selected.

Namely, when the potential of a word line changes from the nonselection level to the selection level, the potential change is undesirably transmitted to one data line via the unfavorable capacity coupling between the word line and the one data line. Thereby, the potential of the one data line is undesirably changed. However, substantially simultaneously with the selection of the word line, the corresponding dummy word line is selected. Consequently, the potential change of the dummy word line, i.e., the potential change from the nonselection level to the selection level, is transmitted to also the other data line via the unfavorable capacity coupling between the dummy word line and the other data line. Accordingly, the potential of the other data line is also undesirably changed. The potential change of the one data line and that of the other data line are the same in phase. Since the unit sense amplifier for amplifying the potential difference between the pair of data lines is constituted by substantially a differential amplifier circuit, the undesirable potential change in each of the pair of data lines is hardly amplified. Accordingly, it is possible to obtain a ROM which will very rarely malfunction.

By providing the compensating circuits as shown in FIGS. 2A and 2B, it is possible to obtain a semiconductor memory with fewer possible malfunctions.

More specifically, the capacitance formed between the one data line and the word line is practically constituted by the capacitance formed between the drain region and the gate electrode of the memory MOSFET formed on the upper side of the data line and that formed between the drain region and the gate electrode of the memory MOSFET formed on the lower side of the data line. On the other hand, the capacitance formed between the other data line and the dummy word line is practically constituted by the capacitance formed between the gate electrode and the drain region of each of two MOSFETs connected to this data line, i.e., one MOSFET in the dummy cell and one MOSFET in the compensating circuit. Since these MOSFETs are formed so as to be substantially equal in dimensions to each other, the capacitances formed between the gate electrodes and the drain regions of these MOSFETs respectively have values substantially equal to each other. Moreover, since these MOSFETs are simultaneously formed, they have gate-drain capacitances (capacitances formed between the gate electrodes and the drain regions, respectively) substantially equal to each other independently of manufacturing condition variations. Consequently, the value of the capacitance formed between the one data line and the word line and that of the capacitance formed between the other data line and the dummy word line can be made substantially equal to each other independently of manufacturing condition variations. Thereby, the change in potential of the one data line caused by the change in potential of the word line and the change in potential of the other data line caused by the change in potential of the dummy word line can be made substantially equal to each other. Since these changes in potential of the pair of data lines are the same in phase, these changes are not practically amplified by the differential amplifier circuit constituting the unit sense amplifier. Accordingly, it is possible to obtain a semiconductor memory with fewer possible malfunctions.

In the unit sense amplifier, the differential amplifier circuit is wired so as to constitute a latching circuit. Therefore, it is possible to amplify the potential difference between the data lines to a predetermined potential in a relatively short period of time, so that the readout operation of the ROM can be made higher in speed. In addition, since the latching circuit is constituted by a CMOS circuit in the embodiment, the potentials of a pair of data lines can be amplified to the supply voltage and the circuit ground potential, respectively.

Between a pair of input/output terminals of the main amplifier in the above-described unit latching circuit MA$_0$ are provided precharging MOSFETs constituted by P-channel MOSFETs Q$_{10}$ and Q$_{11}$, together with a short-circuiting P-channel MOSFET Q$_{12}$ for uniforming the precharging levels of these MOSFETs. This short-circuiting MOSFET Q$_{12}$ has substantially the same function as the short-circuiting MOSFET Q$_7$ described hereinbefore. A timing signal $\bar{\phi}_S$ is applied to the gates of the respective MOSFETs Q$_{10}$ to Q$_{12}$.

The main amplifier is constituted by a dynamic differential amplifier circuit in the same manner as the unit sense amplifier SA$_0$. More specifically, the main amplifier is constituted by a latching circuit comprising two CMOS inverters each composed of a P-channel MOSFET Q$_{13}$ (Q$_{14}$) and an N-channel MOSFET Q$_{15}$ (Q$_{16}$), and an N-channel MOSFET Q$_{18}$ as a power switch.

The output signal from the unit main amplifier, i.e., the output signal taken out from a node NB$_0$, is applied to an inverter which is constituted by a P-channel MOSFET Q$_{19}$ and N-channel MOSFETs Q$_{20}$ and Q$_{21}$ and functions practically as a tristate circuit. From the inverter, an output signal BL$_0$ is taken out. A timing signal $\phi_{la}$ is applied to the gate of the N-channel MOSFET Q$_{21}$ provided to the inverter and the gate of the MOSFET Q$_{18}$ for controlling the operation of the above-mentioned differential circuit. During the period when the timing signal $\phi_{la}$ is high, the differential circuit amplifies the signal transmitted from the unit sense amplifier SA$_0$ and latches the same. Therefore, a static output signal BL$_0$ is delivered from the unit latching circuit MA$_0$ constituted by the inverters and the main amplifier.

Although not especially limitative, the main amplifier is provided with a P-channel MOSFET Q$_{17}$ having the same function as the MOSFET Q$_5$ in the above-described unit sense amplifier. More specifically, when the input/output terminal of the main amplifier and the like are under precharging, the timing signal $\bar{\phi}_S$ is held low. Consequently, the MOSFET Q$_{17}$ is turned ON, and the precharging of the main amplifier and the like is effected from also the MOSFET Q$_{17}$, thereby allowing the precharging speed to be higher.

Moreover, while the main amplifier and the like are being precharged, the timing signal $\phi_{la}$ is held low. In addition, since the node NB$_0$ is made high in level by the precharging, the MOSFET Q$_{19}$ is also turned OFF. Consequently, the level of the output signal BL$_0$ having been delivered from the inverter before the precharging of the main amplifier is held by the stray or parasitic capcitance coupled to the line for transmitting the output signal $BL_0$ and the stray or parasitic capacitance of the MOSFETs $Q_{19}$ and $Q_{20}$. Accordingly, even when the main amplifier is being precharged, the same output signal as that delivered before the precharging is delivered from the inverter.

Figure 4:
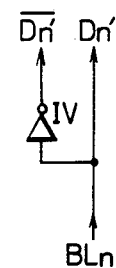
FIG. 4 is a logical symbol diagram of an example of an inverter circuit.
Figure 15:
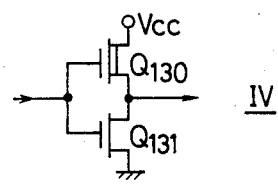
FIG. 15 is a circuit diagram of an example of an inverter circuit.

The output signals $BL_0$ to $BL_{37}$ delivered from the unit latching circuits $MA_0$ to $MA_{37}$ are supplied to inverters IV such as shown in FIG. 4, respectively, to form signals $\overline{D_0}'$ to $\overline{D_{31}}'$ and $\overline{P_0}$ to $\overline{P_5}$ formed by inverting the phase of the output signals $BL_0$ to $BL_{37}$, respectively, and signals $D_0'$ to $D_{31}'$ and $P_0$ to $P_5$ corresponding to the output signals $BL_0$ to $BL_{37}$. These signals are supplied to the ECC circuit ECC in the subsequent stage, described later. It is to be noted that each of the inverters IV is a static CMOS inverter constituted by a P-channel MOSFET and an N-channel MOSFET such as shown in FIG. 15, although not especially limitative thereto.

Figure 5:
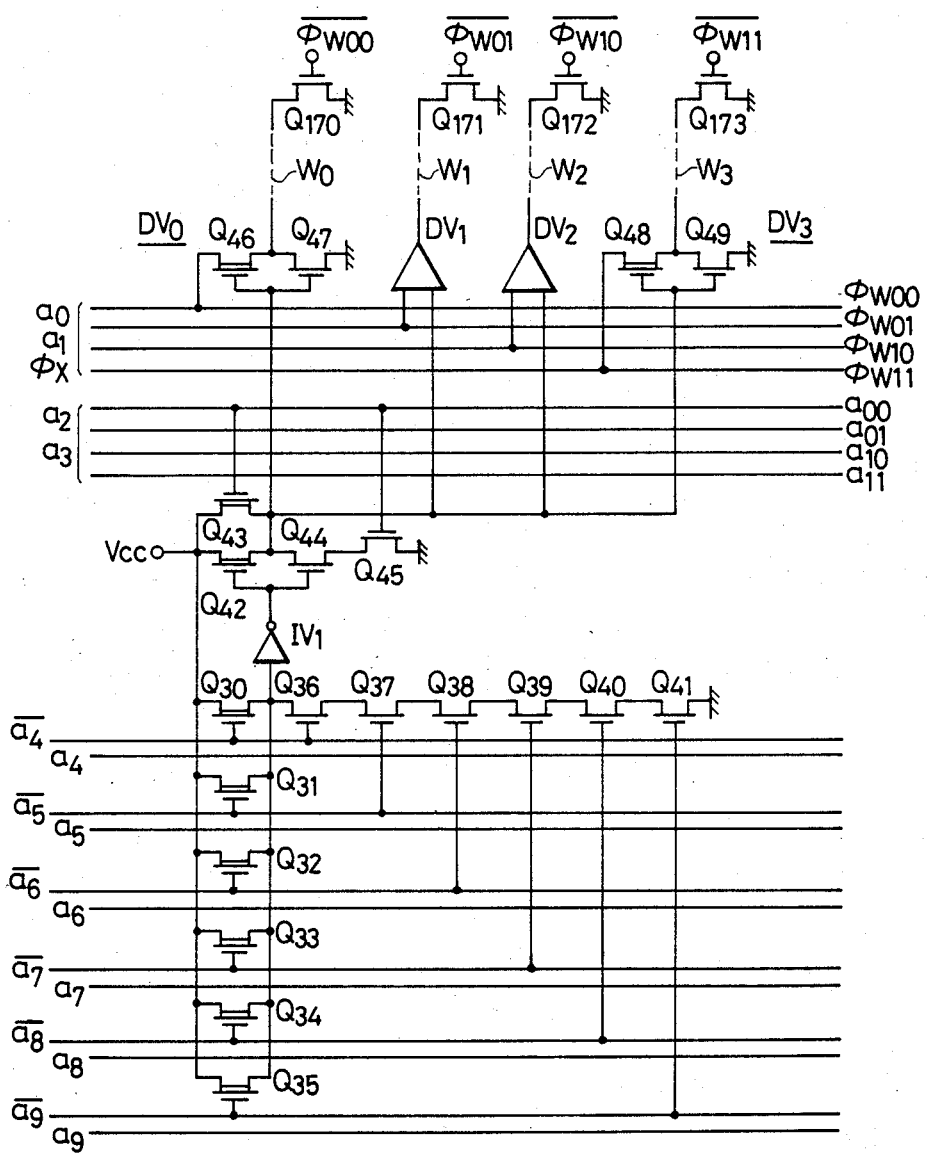
FIG. 5 is a circuit diagram of an example of an X decoder such as used in FIG. 1.

FIG. 5 shows a practical circuit of the X decoder X-DCR₁ shown in FIG. 1.

The X decoder X-DCR₁ is constituted by a plurality of unit decoders. The Figure shows the circuit of one of these plurality of unit decoders.

In the embodiment, a selecting signal for selecting a word line is formed in three stages. More specifically, address signals are decoded in three stages.

The internal address signals $a_4$ to $a_9$ and $\overline{a_4}$ to $\overline{a_9}$ are decoded by a decoder circuit constituted by a plurality of NAND circuits. The Figure shows the circuit of one of the plurality of NAND circuits. More specifically. a CMOS NAND circuit is constituted by P-channel MOSFETs $Q_{30}$ to $Q_{35}$ and N-channel MOSFETs $Q_{36}$ to $Q_{41}$. The NAND circuit is supplied with the internal address signals $\overline{a_4}$ to $\overline{a_9}$ as shown in the Figure.

The internal address signals $a_2$, $\overline{a_2}$ and $a_3$, $\overline{a_3}$ are supplied to the decoder circuit constituted by four two-input AND circuits, although not especially limitative thereto. In this decoder circuit, the internal address signals are decoded to form decoded signals $a_{00}$ to $a_{11}$. For instance, when each of the internal address signals $\overline{a_2}$ and $\overline{a_3}$ is "1", the decoder circuit delivers the decoded signal $a_{00}$ of high level ("1") and the decoded signals $a_{01}$ to $a_{11}$ of low level ("0").

A two-input NAND circuit is constituted by P-channel MOSFETs $Q_{42}$, $Q_{43}$ and N-channel MOSFETs $Q_{44}$, $Q_{45}$. One input terminal of this NAND circuit is supplied with the output signal of the CMOS NAND circuit phase-inverted by the inverter $IV_1$, while the other input terminal is supplied with the decoded signal $a_{00}$. This NAND circuit forms selecting signals for four word lines. These selecting signals are applied to the gates of four word line driving circuits $DV_0$ to $DV_3$, respectively, each comprising a P-channel MOSFET $Q_{46}$ and N-channel MOSFET $Q_{47}$ which are connected in an inverter form.

The internal address signals $a_0$, $\overline{a_0}$ and $a_1$, $\overline{a_1}$ are supplied to a decoder circuit constituted by a plurality of AND circuits, although not especially limitative thereto. The decoder circuit is further supplied with the word line selecting timing signal $\phi_X$. In the decoder circuit, the internal address signals $a_0$, $\overline{a_0}$ and $a_1$, $\overline{a_1}$ are decoded, and the decoded signals formed by the decoding are delivered as word line selecting signals $\phi_{W00}$ to $\phi_{W11}$ in synchronism with the word line selecting timing signal $\phi_X$. For instance, when both the internal address signals $a_0$ and $a_1$ are made high ("1"), the decoder circuit delivers the high-level word line selecting timing signal $\phi_{W00}$ in synchronism with the word line selecting timing signal $\phi_X$. At this time, the word line selecting timing signals $\phi_{W01}$, $\phi_{W10}$ and $\phi_{W11}$ are held low.

The four kinds of word line selecting timing signals $\phi_{W00}$ to $\phi_{W11}$ formed in synchronism with the word line selecting timing signal $\phi_X$ are transmitted to the drains of the P-channel MOSFETs $Q_{46}$ of the respective driving circuits $DV_0$ to $DV_3$, respectively.

Thereby, for instance, when all the internal address signals $\overline{a_0}$ to $\overline{a_9}$ are made low ("0"), in other words, when all the internal address signals $a_0$ to $a_9$ are made high ("1"), the MOSFET $Q_{46}$ in the driving circuit $DV_0$ is turned ON, and in synchronism with the selecting timing signal $\phi_X$, the high-level word selecting timing signal $\phi_{W00}$ is transmitted to the word line $W_0$ via the MOSFET $Q_{46}$. As a result, the potential of the word line $W_0$ rises to the high level which is the memory cell selecting level.

Although not especially limitative, each word line is connected with an N-channel MOSFET for holding the potential of the nonselected word lines at the circuit ground potential on the opposite side to the corresponding word line driving circuit. The gates of the MOSFETs are supplied with signals formed by phase-inverting the word line selecting timing signals $\phi_{W00}$ to $\phi_{W11}$ supplied to the word line driving circuits corresponding thereto, respectively. For example, the word line $W_0$ connected to the driving circuit $DV_0$ is connected with a MOSFET $Q_{170}$ having its gate supplied with a signal $\overline{\phi_{W00}}$ formed by phase-inverting the timing signal $\phi_{W00}$. Thus, the potential across a word line not selected, e.g., the word line $W_3$, is made the ground potential by the MOSFETs $Q_{48}$ and $Q_{173}$. Accordingly, it is possible to prevent selection of any undesired word line, such as multiselection of word lines, so that possible malfunctions can be reduced. It is possible to readily form the timing signals $\overline{\phi_{W00}}$ to $\overline{\phi_{W11}}$ by, for example, phase-inverting the timing signals $\phi_{W00}$ to $\phi_{W11}$ by means of the respective inverters.

The following advantages are offered by arranging for the internal address signal to be decoded in a plurality of stages as in the case of the X decoder in the embodiment.

Firstly, it is possible to prevent production of any wasteful blank portion in the IC chip, so that the IC chip can be made more compact. The decoder circuit can be constituted by, for example, a plurality of AND circuits. If it is attempted to decode a multiplicity of internal address signals by a single AND circuit, the AND circuit is inevitably constituted by a multiplicity of MOSFETs, which disadvantageously requires a relatively large area. Consequently, it is difficult to make the lateral arrangement pitch of the AND circuits coincide with the word line arrangement pitch in the memory arrays.

In order to transmit the selecting signals delivered from the AND circuits to the corresponding word lines, it is necessary to enlarge the word line arrangement pitch, for example. In such a case, the distance between the adjacent word lines enlarges, causing wasteful blank portions to be produced in the IC chip. On the other hand, in the X decoder in accordance with the embodiment, the internal address signals are decoded by combinations of a plurality of small decoder circuits. Since a small decoder circuit can be constituted by fewer MOSFETs, the decoder circuit can be readily formed so as to match with the distance between the adjacent word lines. Accordingly, it is possible to reduce wasteful blank portions in the IC chip.

Secondly, it is possible to lighten the load on one internal address signal line, so that the potential change of the internal address signal can be made faster. This is because since the decoder circuit requires fewer MOSFETs for receiving one internal address signal, the load connected to the wire for transmitting the internal address signal is lightened.

Figure 7:
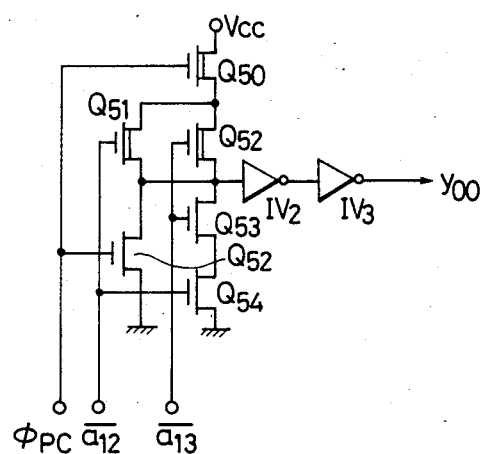
FIG. 7 is a circuit diagram of an example of a Y decoder Y-DCR$_1$ as used in FIG. 1.

FIG. 7 shows a part of the circuit of the Y decoder Y-DCR$_1$ shown in FIG. 1. Shown in the Figure is one unit decoder in the decoder circuit which forms the decoded signals y$_{00}$ to y$_{11}$ to be supplied to the MOSFETs S$_8$ to S$_{11}$ constituting the column switch shown in FIGS. 2A and 2B. More specifically, the decoder circuit for forming the decoder signals y$_{00}$ to y$_{11}$ is constituted by four unit decoders, although not especially limitative thereto. Although the Figure shows only the unit decoder for forming the decoded signal y$_{00}$, the other three unit decoders are constituted in practically the same manner as the illustrated one.

The unit decoder is constituted by MOSFETs Q$_{50}$ to Q$_{54}$ and inverters IV$_2$, IV$_3$ as described hereinunder.

A two-input NAND gate is constituted by the parallel-connected P-channel MOSFETs Q$_{51}$ and Q$_{52}$ and the series-connected N-channel MOSFETs Q$_{53}$ and Q$_{54}$. When the decoded signal y$_{00}$, for example, is formed, the internal address signals $\overline{a_{12}}$ and $\overline{a_{13}}$ are applied to the NAND gate. The P-channel MOSFETs Q$_{50}$ is provided in series to the parallel-connected MOSFETs Q$_{51}$ and Q$_{52}$, while the N-channel MOSFET Q$_{52}$ is provided in parallel to the series-connected MOSFETs Q$_{53}$ and Q$_{54}$. The timing signal $\phi_{PC}$ is applied to the gates of the respective MOSFETs Q$_{50}$ and Q$_{52}$.

The output signal from this logical gate circuit is passed through the inverters IV$_2$ and IV$_3$ to form the decoded signal y$_{00}$.

The decoded signals y$_0$ and y$_1$ to be supplied to the MOSFETs S$_0$ to S$_7$ constituting the column switch shown in FIGS. 2A and 2B are also formed by two unit decoders similar to the unit decoder shown in FIG. 7. More specifically, each unit decoder receives a one-bit internal address signal and the timing signal $\phi_{PC}$ and forms the decoded signals y$_0$ and y$_1$.

The timing signal $\phi_{PC}$ is held high during the precharging period when the precharging signal $\overline{\phi_{PC}}$ is held low in order to precharge the data lines.

Figure 18:
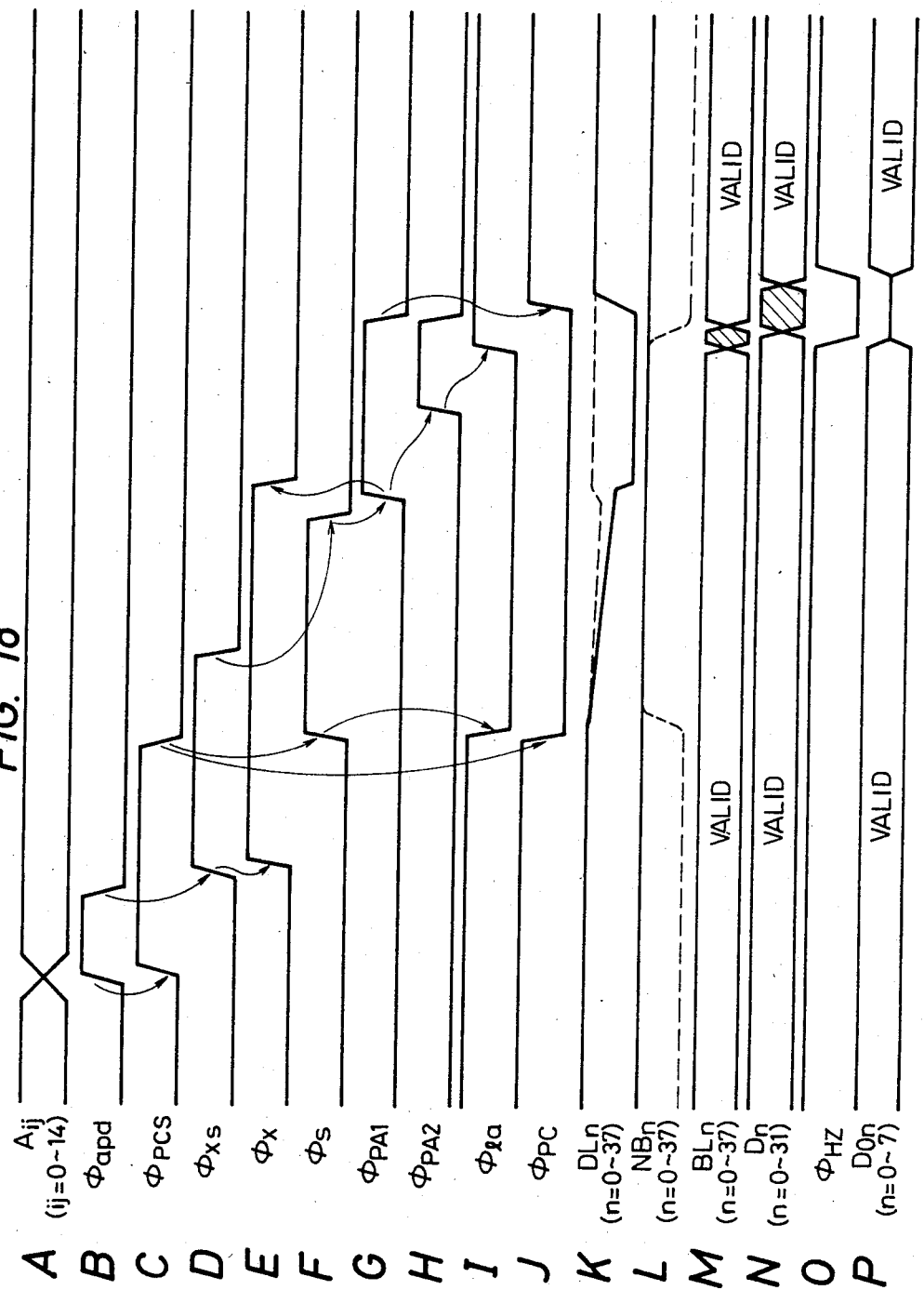
FIG. 18 A-P are waveform charts for describing the operation of each of the address transition detector ATD, the control signal generator CSG and the ROM shown in FIG. 1.

Consequently, the decoded signals y$_0$, y$_1$ and y$_{00}$ to y$_{11}$ are all made low. Accordingly, the P-channel MOSFETs S$_0$ to S$_{11}$ constituting the column switch are all turned ON. In consequence, during the precharging period, the stray or parasitic capacitance of the data lines and the stray or parasitic capacitance coupled to the common data lines are precharged by the precharging MOSFETs P$_1$, P$_3$, P$_5$ and P$_7$ which are turned ON by the precharging signal $\overline{\phi_{PC}}$ being made low, and moreover, the above-mentioned capacitances are precharged from the unit sense amplifier side via the MOSFETs constituting the unit column switch. More specifically, as shown in FIG. 18, the timing signal $\phi_{PA1}$ is held low during the precharging period. Thereby, the MOSFET Q$_5$ in the unit sense amplifier SA$_0$ is turned ON, so that the supply voltage V$_{CC}$ is applied to one electrodes of the N-channel MOSFETs Q$_3$ and Q$_4$. The potentials of the data lines are applied to the gates of the respective N-channel MOSFETs Q$_3$ and Q$_4$ via the P-channel MOSFETs constituting the unit column switch which are turned ON by the decoded signals y$_0$, y$_1$ and y$_{00}$ and y$_{11}$. As the potentials of the common data lines are raised through the precharging of the data lines and the common data lines effected by the precharging MOSFETs, the N-channel MOSFETs Q$_3$ and Q$_4$ are turned ON. As a result, the stray and parasitic capacitances of the data lines are precharged via the MOSFET Q$_5$, the N-channel MOSFET Q$_3$ (Q$_4$) and the MOSFETs constituting the unit column switch. More specifically, the capacitances coupled to the common data lines and the data lines are precharged by the precharging elements from both ends of each data line. By thus precharging the data lines through the precharging MOSFETs and the unit sense amplifier, it is possible to raise the data line potentials to a desired value in a short period of time, so that the operation of the ROM can be made higher in speed.

Figure 9:
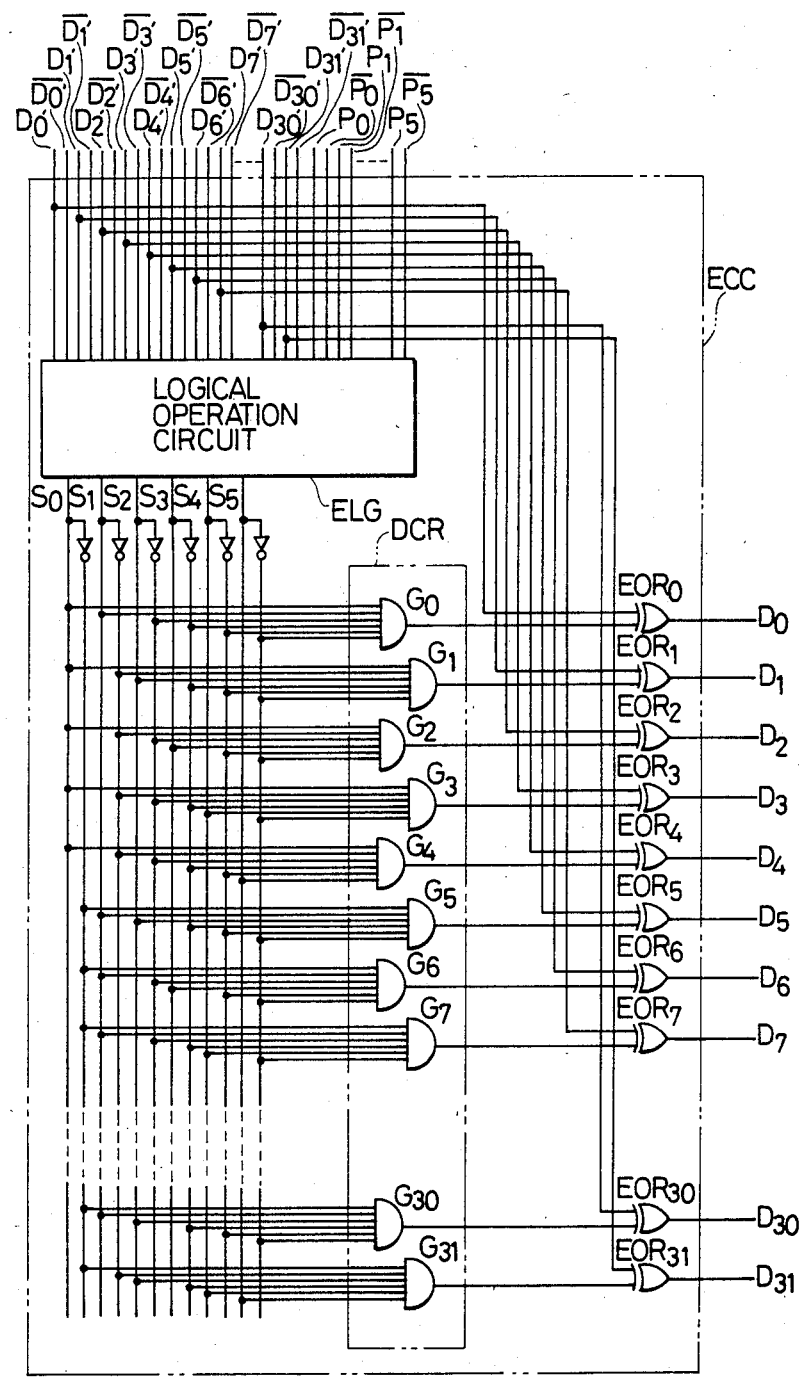
FIG. 9 schematically shows an example of an ECC circuit such as used in FIG. 1.

FIG. 9 is a schematic illustration of an example of the ECC circuit shown in FIG. 1.

A logical operation circuit ELG receives the 38-bit signals D$_0'$, $\overline{D_0'}$ to D$_{31}'$, $\overline{D_{31}'}$ and P$_0$, $\overline{P_0}$ to P$_5$, $\overline{P_5}$ delivered from the memory arrays and forms syndromes S$_0$ to S$_5$ for indicating error bits by exclusive ORs of predetermined combinations.

In the 38-bit data written in the memory arrays, the six-bit parity check bits P$_0$ to P$_5$ having their respective values previously set in accordance with the 32-bit data signals and a proper check matrix.

Table 1 below shows an example of the check matrix.

TABLE 1

| | Check matrix | | | | | | | | | | | | | | | | | | | | |
|---|---|---|---|---|---|---|---|---|---|---|---|---|---|---|---|---|---|---|---|---|---|
| | Information bits Bit No. | | | | | | | | | | | | | | | | | | | | |
| Syndrome | D$_0$ | D$_1$ | D$_2$ | D$_3$ | D$_4$ | D$_5$ | D$_6$ | D$_7$ | D$_8$ | D$_9$ | D$_{10}$ | D$_{11}$ | D$_{12}$ | D$_{13}$ | D$_{14}$ | D$_{15}$ | D$_{16}$ | D$_{17}$ | D$_{18}$ | D$_{19}$ |
| S$_0$ | 1 | 1 | 1 | 1 | 1 | | | | | | | | | | 1 | 1 | 1 | 1 | 1 | 1 |
| S$_1$ | 1 | | | | | 1 | 1 | 1 | 1 | | | | | | 1 | 1 | 1 | 1 | | |
| S$_2$ | | 1 | | | | 1 | | | | 1 | 1 | 1 | | | 1 | | | | 1 | 1 |
| S$_3$ | | | 1 | | | | 1 | | | 1 | | | 1 | 1 | | 1 | | | 1 | |
| S$_4$ | | | | 1 | | | | 1 | | | 1 | | 1 | | | | 1 | 1 | | 1 |
| S$_5$ | | | | | 1 | | | | 1 | | | 1 | | 1 | | 1 | | | | |

| | Information bits Bit No | | | | | | | | | | | | Parity bits | | | | | |
|---|---|---|---|---|---|---|---|---|---|---|---|---|---|---|---|---|---|---|
| Syndrome | D$_{20}$ | D$_{21}$ | D$_{22}$ | D$_{23}$ | D$_{24}$ | D$_{25}$ | D$_{26}$ | D$_{27}$ | D$_{28}$ | D$_{29}$ | D$_{30}$ | D$_{31}$ | P$_0$ | P$_1$ | P$_2$ | P$_3$ | P$_4$ | P$_5$ |
| S$_0$ | 1 | 1 | | | | | | | 1 | 1 | | | 1 | | | | | |
| S$_1$ | | | 1 | 1 | 1 | 1 | | | 1 | | | | | 1 | | | | |
| S$_2$ | | | 1 | 1 | | | 1 | 1 | 1 | | 1 | 1 | | | 1 | | | |
| S$_3$ | 1 | 1 | 1 | | 1 | | 1 | 1 | | | | | | | | 1 | | |
| S$_4$ | 1 | | | 1 | | 1 | 1 | | | 1 | | | | | | | 1 | |

TABLE 1-continued

| | Check matrix Information bits Bit No. | | | | | | | |
|---|---|---|---|---|---|---|---|---|
| $S_5$ | 1 | | 1 | 1 | 1 | 1 | 1 | 1 |

In Table 1, a flag 1 is added to each of bits to be checked.

Table 2 below shows a practical example of data W to be written into the memory arrays. It is to be noted that in Table 2, data signals are denoted by symbols $B_0$ to $B_{31}$, while parity signals are designated by symbols $BP_0$ to $BP_5$.

TABLE 2

| (W) | $B_0$ | $B_1$ | $B_2$ | $B_3$ | $B_4$ | $B_5$ | $B_6$ | $B_7$ | $B_8$ | $B_9$ | $B_{10}$ | $B_{11}$ | $B_{12}$ | $B_{13}$ | $B_{14}$ | $B_{15}$ | $B_{16}$ | $B_{17}$ | $B_{18}$ | $B_{19}$ | $B_{20}$ | $B_{21}$ |
|---|---|---|---|---|---|---|---|---|---|---|---|---|---|---|---|---|---|---|---|---|---|---|
| | 1 | 1 | 1 | 1 | 1 | 0 | 0 | 0 | 0 | 0 | 0 | 0 | 0 | 0 | 1 | 1 | 1 | 1 | 1 | 1 | 1 | 1 |

| | $B_{22}$ | $B_{23}$ | $B_{24}$ | $B_{25}$ | $B_{26}$ | $B_{27}$ | $B_{28}$ | $B_{29}$ | $B_{30}$ | $B_{31}$ | $BP_0$ | $BP_1$ | $BP_2$ | $BP_3$ | $BP_4$ | $BP_5$ |
|---|---|---|---|---|---|---|---|---|---|---|---|---|---|---|---|---|
| | 0 | 0 | 0 | 0 | 0 | 0 | 1 | 1 | 0 | 0 | 1 | 1 | 1 | 1 | 1 | 1 |

The value of each parity bit is determined by checking the bits indicated in Table 1 in the 32-bit data signals to be written. The parity bit to be obtained has such a value that the combined exclusive OR value of the bit signals checked and the parity bit to be obtained will be "0". In other words, each parity bit is set so that the combined exclusive OR value of the bits respectively checked according to Table 1 will be "0".

For example, the parity bit $BP_0$ in Table 2 is set as follows. Namely, for setting the parity bit $BP_0$, the data bits $B_0$ to $B_4$, $B_{14}$ to $B_{21}$ and $B_{28}$ to $B_{29}$ are checked in the 32-bit data bits $B_0$ to $B_{31}$ in accordance with the first line (syndrome $S_0$) of Table 1. The exclusive OR of these data bits checked is "1". Therefore, the parity bit $BP_0$ is decided to be "1" correspondingly. More specifically, the parity bit $BP_0$ is set so that the exclusive OR of the data bits checked and the parity bit $BP_0$ will be "0".

Then, in the similar manner, data are checked on the basis of the second to fifth lines (syndromes $S_1$ through $S_5$) of Table 1, and the parity bits $BP_1$ to $BP_5$ are determined so that the exclusive OR with respect to each parity bit will be "0".

In the case where each of the 32-bit data bits is set to be such a value as shown in Table 2, the parity bits $BP_0$ to $BP_5$ are all "1" as shown in the Table.

As will be clear from Table 1 and the previous description related thereto, logical formulae for calculating the syndromes $S_0$ to $S_5$ are such as the following formulae (3) to (8):

$$S_0 = B_0 \oplus B_1 \oplus B_2 \oplus B_3 \oplus B_4 \oplus B_{14} \oplus B_{15} \oplus B_{16} \oplus B_{17} \oplus B_{18} \oplus B_{19} \oplus B_{20} \oplus B_{21} \oplus B_{28} \oplus B_{29} \oplus BP_0 \quad (3)$$

$$S_1 = B_0 \oplus B_5 \oplus B_6 \oplus B_7 \oplus B_8 \oplus B_{14} \oplus B_{15} \oplus B_{16} \oplus B_{17} \oplus B_{22} \oplus B_{23} \oplus B_{24} \oplus B_{25} \oplus B_{30} \oplus BP_1 \quad (4)$$

$$S_2 = B_1 \oplus B_5 \oplus B_9 \oplus B_{10} \oplus B_{11} \oplus B_{14} \oplus B_{18} \oplus B_{19} \oplus B_{22} \oplus B_{23} \oplus B_{26} \oplus B_{27} \oplus B_{28} \oplus B_{30} \oplus B_{31} \oplus BP_2 \quad (5)$$

$$S_3 = B_2 \oplus B_6 \oplus B_9 \oplus B_{12} \oplus B_{13} \oplus B_{15} \oplus B_{18} \oplus B_{20} \oplus B_{21} \oplus B_{22} \oplus B_{24} \oplus B_{26} \oplus B_{27} \oplus BP_3 \quad (6)$$

$$S_4 = B_3 \oplus B_7 \oplus B_{10} \oplus B_{12} \oplus B_{16} \oplus B_{19} \oplus B_{20} \oplus B_{23} \oplus B_{25} \oplus B_{26} \oplus B_{29} \oplus B_{31} \oplus BP_4 \quad (7)$$

$$S_5 = B_4 \oplus B_8 \oplus B_{11} \oplus B_{13} \oplus B_{17} \oplus B_{21} \oplus B_{24} \oplus B_{25} \oplus B_{27} \oplus B_{28} \oplus B_{29} \oplus B_{30} \oplus B_{31} \oplus BP_5 \quad (8)$$

It is to be noted that in these logical formulae, the mark $\oplus$ is an exclusive OR symbol.

The logical operation circuit ELG shown in FIG. 9 is constituted by logical circuits, not shown, for forming the syndromes $S_0$ to $S_5$ satisfying the above formulae (3) to (8). It is to be noted that it is possible to select at will the order of combining the exclusive ORs of a plurality of bits with each other. Accordingly, the exclusive ORs of, e.g., the four bits $B_0$ to $B_3$ may be obtained in such a way that an output $B_0 \oplus B_1$ is formed by means of a first exclusive OR circuit and an output $B_2 \oplus B_3$ is formed by means of a second exclusive OR circuit and then the formed two outputs are supplied to a third exclusive OR circuit. As will be apparent from comparison between the formulae (3) to (8), for example, the exclusive OR of the bits $B_{14}$ to $B_{17}$ appears in the formulae (3) and (4) in common. The exclusive OR of the bits $B_{18}$ and $B_{19}$ appears in the formulae (3) and (5) in common. Accordingly, in order to reduce the number of the logical circuits constituting the logical operation circuit ELG, the exclusive ORs common to the formulae may be previously formed by means of mutual circuits, respectively.

The defects previously produced in the memory MOSFETs, switching MOSFETs and signal wirings to be selected and the practical defects caused in the circuit operation by an undesirable change in the circuit operation conditions will give errors to the readout data to be supplied to the ECC circuit.

Assuming now that memory cells in which the write data W as shown in Table 2 should have been written are selected, and the readout data R at that time is erroneous as shown in Table 3 below, for example. More specifically, it is assumed that the seventh bit $B_7$ of the readout data R has changed from "0" to "1".

TABLE 3

| (R) | $B_0$ | $B_1$ | $B_2$ | $B_3$ | $B_4$ | $B_5$ | $B_6$ | $B_7$ | $B_8$ | $B_9$ | $B_{10}$ | $B_{11}$ | $B_{12}$ | $B_{13}$ | $B_{14}$ | $B_{15}$ | $B_{16}$ | $B_{17}$ | $B_{18}$ | $B_{19}$ | $B_{20}$ | $B_{21}$ |
|---|---|---|---|---|---|---|---|---|---|---|---|---|---|---|---|---|---|---|---|---|---|---|
| | 1 | 1 | 1 | 1 | 1 | 0 | 0 | 1 | 0 | 0 | 0 | 0 | 0 | 0 | 1 | 1 | 1 | 1 | 1 | 1 | 1 | 1 |

| | $B_{22}$ | $B_{23}$ | $B_{24}$ | $B_{25}$ | $B_{26}$ | $B_{27}$ | $B_{28}$ | $B_{29}$ | $B_{30}$ | $B_{31}$ | $BP_0$ | $BP_1$ | $BP_2$ | $BP_3$ | $BP_4$ | $BP_5$ |
|---|---|---|---|---|---|---|---|---|---|---|---|---|---|---|---|---|
| | 0 | 0 | 0 | 0 | 0 | 0 | 1 | 1 | 0 | 0 | 1 | 1 | 1 | 1 | 1 | 1 |

When the data R is supplied, the logical operation circuit ELG in the ECC circuit carries out logical operations on the syndromes $S_0$ through $S_5$ in accordance with the formulae (3) through (8). In the operation process for calculating the syndromes $S_0$ through $S_5$, the seventh bit $B_7$ is employed in the logical operations for calculating the syndromes $S_1$ and $S_4$ as will be clear from Table 1. Due to the fact that the seventh bit $B_7$ has changed from "0" to "1", each of the syndromes $S_1$ and $S_4$ becomes "1". The bits are not erroneous which are taken in the operation processes for calculating the other syndromes $S_0$, $S_2$, $S_3$ and $S_5$. Therefore, each of the syndromes $S_0$, $S_2$, $S_3$ and $S_5$ becomes "0".

More specifically, when the readout data R such as shown in Table 3 is delivered, the bit pattern of the syndromes $S_5$ through $S_0$ delivered from the logical operation circuit ELG becomes "010010". This bit pattern coincides with the bit pattern of the syndromes $S_5$ through $S_0$ indicating the seventh bit $D_7$ in the check matrix shown in Table 1. More specifically, in the check matrix, the pattern of the syndromes $S_5$ through $S_0$ in the row of the bit $D_7$ is "010010", which coincides with the bit pattern of the syndromes $S_5$ through $S_0$ delivered from the logical operation circuit. It is to be noted that each of blank columns in the check matrix is regarded as "0".

As will be apparent from Table 1, a plurality of check bits are set to each of the 38-bit signals. The check bits set to one signal have a pattern corresponding to only this signal.

Owing to the fact that the check matrix is arranged as shown in Table 1, the bit patterns constituted by the syndromes $S_5$ through $S_0$ delivered from the logical operation circuit ELG shown in FIG. 9 correspond to the positions of the error data bits in the readout data R respectively.

The syndromes $S_0$ through $S_5$ delivered from the logical operation circuit ELG are fed to the decoder DCR directly and via inverters.

The decoder DCR delivers a decoded signal representative of the error digit by decoding the syndromes $S_0$ through $S_5$. Although not especially limitative, the decoder DCR is constituted by AND gates $G_0$ to $G_{31}$ made to correspond to the 32-bit data signals respectively. The AND gates $G_0$ to $G_{31}$ *have their respective inputs determined so as to detect bit patterns different from each other. Each AND gate delivers a* "0" level signal when the data bit made to correspond thereto is not erroneous but delivers a "1" level signal when the data bit is erroneous. For example, the AND gate $G_0$, as will be obvious from the illustrated connection and the check matrix shown in Table 1, delivers a "1" level signal when the first digit (first bit) signal in the 32-bit data signals is erroneous but delivers a "0" level signal when the signal is not erroneous.

The outputs of the decoder DCR, i.e., the outputs of the respective AND gates $G_0$ to $G_{31}$, and the data bits $B_0$ to $B_{31}$ of the readout data R are fed to exclusive OR circuits $EOR_0$ to $EOR_{31}$ respectively. The exclusive OR circuits $EOR_0$ to $EOR_{31}$ form corrected output data $D_0$ to $D_{31}$ to be supplied to the multiplexor MPX shown in FIG. 1. For instance, if the seventh data signal has an error as shown in Table 3, the output of the AND gate $G_6$ becomes "1" correspondingly, so that the seventh signal erroneously read out as "1" is inverted from "1" to "0" by the exclusive circuit $EOR_7$. More specifically, the value of the data signal $D_6$ is revised to the correct value.

It is to be noted that the ECC circuit in accordance with the embodiment is able to correct the error for one bit but unable to correct the error over two or more bits. To obtain an ECC circuit capable of correcting the error over two bits, the construction thereof is required to be complicated, and the number of needed elements increases. Moreover, in such a case, it is necessary to largely increase the number of parity bits (redundant bits).

Figure 8:
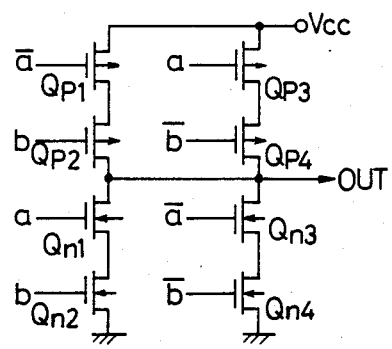
FIG. 8 is a circuit diagram of an example of an exclusive OR circuit such as used in FIG. 9.

FIG. 8 shows a practical example of the exclusive OR circuit provided in the logical operation circuit ELG and employed for the error correction.

The exclusive OR circuit is constituted by P-channel MOSFETs $Q_{p1}$ through $Q_{p4}$ and N-channel MOSFETs $Q_{n1}$ through $Q_{n4}$. The MOSFETs $Q_{p1}$, $Q_{p2}$ and the MOSFETs $Q_{n1}$, $Q_{n2}$ are connected in series. In the same manner, the MOSFETs $Q_{p3}$, $Q_{p4}$ and the MOSFETs $Q_{n3}$, $Q_{n4}$ are connected in series. The connection point between the MOSFETs $Q_{p2}$ and $Q_{n1}$ and the connection point between the MOSFETs $Q_{p4}$ and $Q_{n3}$ are mutually connected to form an output OUT. Input signals a, b are applied to the gates of the respective MOSFETs $Q_{n1}$, $Q_{n2}$, respectively, while input signals $\bar{a}$, $\bar{b}$ are applied to the gates of the respective MOSFETs $Q_{n3}$, $Q_{n4}$, respectively.

Moreover, input signals $\bar{a}$, $\bar{b}$ are applied to the gates of the respective MOSFETs $Q_{p1}$, $Q_{p4}$, respectively, while input signals b, a are applied to the gates of the respective MOSFETs $Q_{p2}$, $Q_{p3}$, respectively.

When both the input signals a, b are high ("1"), the MOSFETs $Q_{n1}$, $Q_{n2}$ are turned ON, causing the output OUT to be low ("0"). To the contrary, when both the input signals $\bar{a}$, $\bar{b}$ are high, the MOSFETs $Q_{n3}$, $Q_{n4}$ are turned ON, similarly causing the output OUT to be low.

When the input signal a (or $\bar{a}$) is low and the input signal $\bar{b}$ (or b) is low, the MOSFETs $Q_{p3}$ (or $Q_{p1}$) and the MOSFET $Q_{p4}$ (or $Q_{p2}$) are turned ON, causing the output OUT to be high. Thus, when the levels of the input signal a, b coincide with each other, the output OUT is made low. On the other hand, when these signals do not coincide with each other, the output OUT is made high.

The illustrated exclusive OR circuit has an advantage of an extremely small power consumption, since the circuit has only eight elements, and no DC current flows between the supply voltage $V_{CC}$ and the ground potential.

In the logical operation circuit ELG in the ECC circuit, logical operations such as shown by the above logical formulae (3) through (8) are carried out in order to form the syndromes $S_0$ through $S_5$ as described hereinbefore. More specifically, a multiplicity of exclusive OR operations are performed in the logical operation circuit.

By employing the exclusive OR circuit such as shown in FIG. 8 as a logical circuit constituting the logical operation circuit ELG, it becomes possible to constitute the circuit with a relatively small number of elements, and moreover, it is possible to make the power consumption thereof comparatively small.

In the embodiment, into the memory MOSFETs constituting the memory arrays M-ARY$_3$ and M-ARY$_4$, binary signals formed by inverting the binary signals to be stored therein are written in order to reduce the number of elements required to constitute the ECC circuit as well as to lessen the power consumption in the ECC circuit. More specifically, to store, for example, a binary signal "1" in the memory MOSFET $M_0$ in the memory array M-ARY$_3$, the binary signal "0" formed by inverting the binary signal "1" is written into the MOSFET $M_0$. Thus, no matter which memory MOS- FETs in the memory arrays M-ARY$_1$ through M-ARY$_4$ are selected, signals having levels made to correspond to those of the binary signals stored in the memory MOSFETs are always delivered from the corresponding unit latching circuits. More specifically, the signals delivered from the respective unit latching circuits are positive-phase outputs D$_n$' at all times, while the signals inverted by inverters are negative-phase outputs $\overline{D_n'}$ at all times. Accordingly, by simply providing the inverters, it becomes possible to supply the signals from the respective unit latching circuits to the exclusive OR circuits in the logical operation circuit ELG, so that the logical operation circuit can be further simplified.

Figure 10:
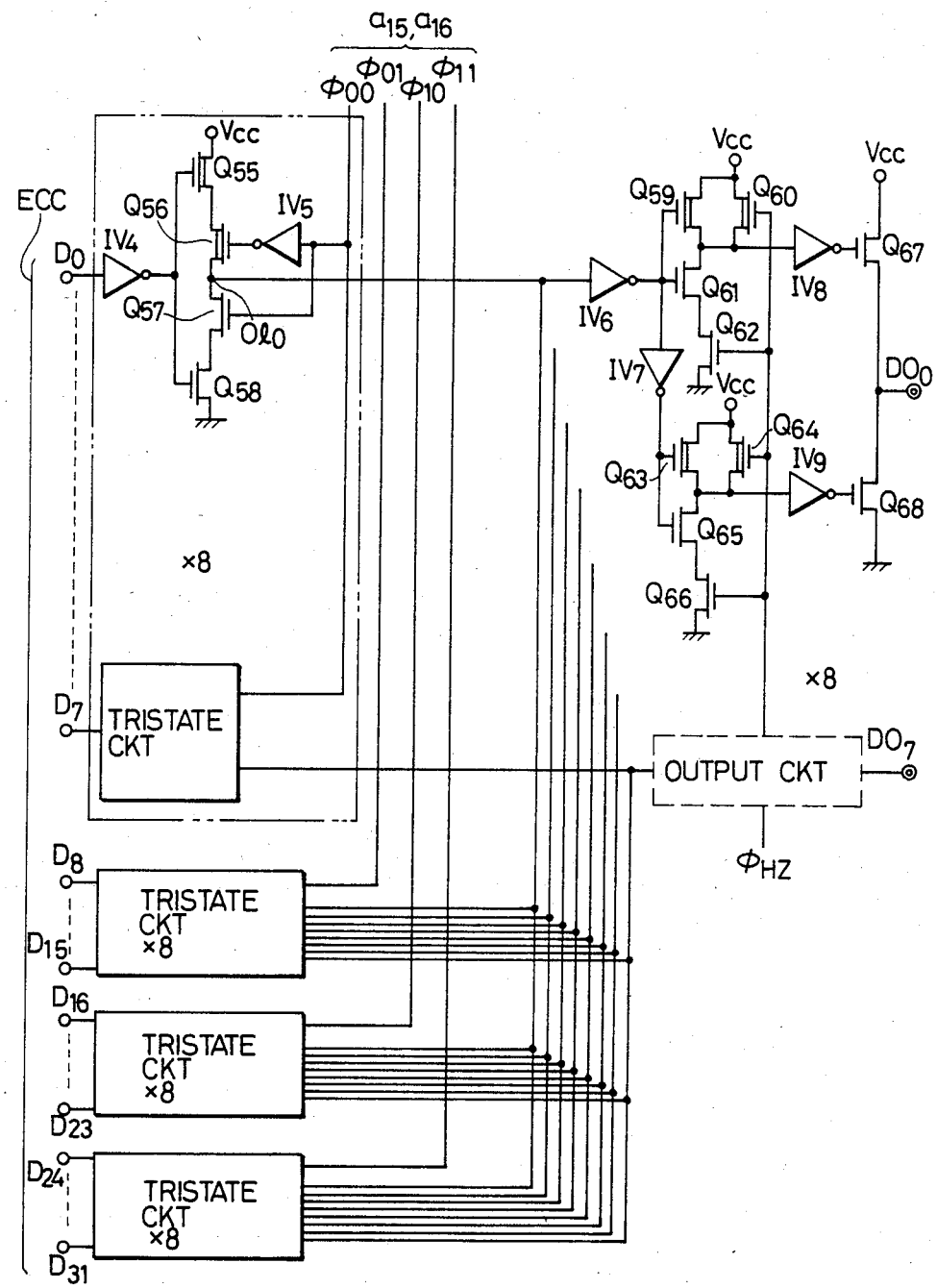
FIG. 10 is a circuit diagram of an example of each of a multiplexor MPX and an output buffer DOB such as used in FIG. 1.

FIG. 10 shows a practical circuit of each of the multiplexer MPX and the output buffer DOB.

The output data D$_0$ to D$_{31}$ from the ECC circuit are transmitted to the output buffer DOB, eight bits by eight bits, by the multiplexor MPX such as described hereinunder.

The multiplexor MPX is constituted in a practical manner by 32 tristate circuits. Eight tristate circuits are combined to form one set. Accordingly, the 32 tristate circuits are divided into four sets.

In the Figure, only the tristate circuit for receiving the signal D$_0$ in the output data D$_0$ through D$_{31}$ is shown in detail. The other 31 tristate circuits have substantially the same construction as the illustrated one.

The data signal D$_0$ is passed through an inverter IV$_4$ and transmitted to the gate of each of a P-channel MOSFET Q$_{55}$ and an N-channel MOSFET Q$_{58}$. The drains of the respective MOSFETs Q$_{55}$ and Q$_{58}$ are connected to an output node O$_{I0}$ via a P-channel MOSFET Q$_{56}$ and an N-channel MOSFET Q$_{57}$, respectively.

Figure 16:
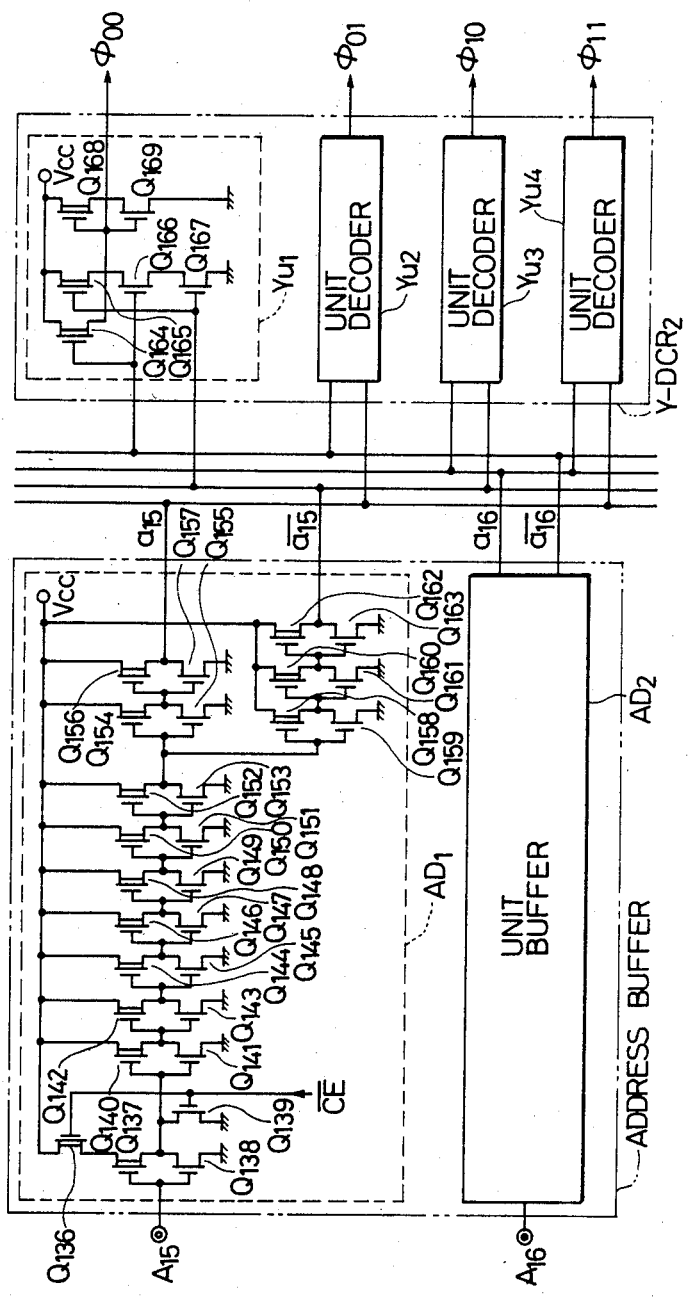
FIG. 16 is a circuit diagram of each of a Y decoder Y-DCR$_2$ and an address buffer ADB from FIG. 1.

Timing signals $\phi_{00}$ to $\phi_{11}$ are formed by an address buffer and the Y decoder Y-DRC$_2$ as shown in FIG. 16, although not especially limitative thereto. The address buffer is constituted by two unit buffers AD$_1$ and AD$_2$. Since the unit buffers have the same construction, the circuit of only the unit buffer AD$_1$ is shown in detail in the Figure. The unit buffer AD$_1$ is constituted by a static circuit. More specifically, the unit buffer AD$_1$ is constituted by MOSFETs Q$_{136}$ to Q$_{163}$. The Y-decoder Y-DCR$_2$ is constituted by four unit decoders Yu$_1$ to Yu$_4$. The unit decoders have the same construction. Therefore, only the unit decoder Yu$_1$ is shown in the Figure. The unit decoder Yu$_1$ is constituted by MOSFETs Q$_{164}$ to Q$_{169}$ and has a circuit configuration requiring no special selecting timing signal, unlike the X decoder shown in FIG. 5. Consequently, the Y decoder Y-DCR$_2$ is able to form the timing signals $\phi_{00}$ to $\phi_{11}$ by employing only the internal address signals supplied from the address buffer.

The Y decoder Y-DCR$_2$ receives the internal address signals a$_{15}$, $\overline{a_{15}}$ and a$_{16}$, $\overline{a_{16}}$ and forms four kinds of selecting signals by decoding these signals.

For instance, when both the internal address signals a$_{15}$ and a$_{16}$ are low ("0"), the timing signal $\phi_{00}$ is made high. The timing signal $\phi_{00}$ is supplied to the gate of the N-channel MOSFET Q$_{57}$ in FIG. 10. Moreover, the timing signal $\phi_{00}$ is inverted by an inverter IV$_5$ and supplied to the gate of the P-channel MOSFET Q$_{56}$.

Accordingly, when the timing signal $\phi_{00}$ is high, both the MOSFETs Q$_{56}$ and Q$_{57}$ are turned ON. Therefore, the data signal D$_0$ is transmitted to the output buffer. When the timing signal $\phi_{00}$ is low, both the MOSFETs Q$_{56}$ and Q$_{57}$ are turned OFF, so that the output node O$_{I0}$ has a high impedance independently of the data signal D$_0$.

Eight tristate circuits, similar to the above tristate circuits, for receiving the eight-bit data signals D$_0$ to D$_7$ are combined to form one set and controlled by the timing signal $\phi_{00}$. The other data signals are also divided so that eight bits form each set: namely, the data signals D$_8$ to D$_{15}$; D$_{16}$ to D$_{23}$; and D$_{24}$ to D$_{31}$. Then, the eight-bit data signals constituting one set are supplied to the corresponding tristate circuits. These tristate circuits are controlled by the other timing signals $\phi_{01}$ to $\phi_{11}$. In addition, output nodes of the four tristate circuits are made common to data eight bits apart from each other, such as the bits D$_0$D$_8$, D$_{16}$, D$_{24}$ which correspond to each other. Accordingly, the total number of output lines from the multiplexor MPX is eight.

The output buffer DOB is constituted by eight output circuits provided so as to correspond to the output lines. Only one of the output circuits is shown in the Figure.

The output circuit comprises two two-input NAND gates constituted by MOSFETs Q$_{59}$ to Q$_{66}$, four inverters IV$_6$ to IV$_9$ and a push-pull output circuit constituted by N-channel MOSFETs Q$_{67}$, Q$_{68}$.

More specifically, the output signal of the inverter IV$_6$ for receiving the output signals from the multiplexor MPX through the output lines is applied to one input of the NAND gate constituted by the MOSFETs Q$_{59}$ to Q$_{62}$. On the other hand, the output signal of the inverter IV$_7$ for receiving the output signal from the inverter IV$_6$ is applied to one input of the NAND gate constituted by the MOSFETs Q$_{63}$ to Q$_{66}$. In addition, a timing signal $\phi_{HZ}$ is applied to the other input of each of these two NAND gates. The output signals from the two NAND gates are transmitted to the gates of the output MOSFETs Q$_{67}$ and Q$_{68}$ through the inverters IV$_8$ and IV$_9$, respectively.

The timing signal $\phi_{HZ}$ is formed on the basis of, for example, reference signals $\phi_{PCS}$ and $\phi_{XS}$ described later with reference to FIG. 11, and the chip selecting signal $\overline{CE}$. The timing signal $\phi_{HZ}$ is held low during the period when the chip is in the nonselected state and the period when the output signals from the ECC circuit are indefinite owing to the fact that new data signals are delivered from the latching circuits to the ECC circuit. When the timing signal $\phi_{HZ}$ is made low, both the output MOSFETs Q$_{67}$ and Q$_{68}$ are turned OFF independently of the output data from the ECC circuit. Consequently, the external output terminal D$_n$ (n=0 to 7) becomes high in impedance. Thereby, it is possible to connect the semiconductor memory in accordance with the embodiment to any system of common data bus type as well as to prevent indefinite data from being delivered.

Figure 11:
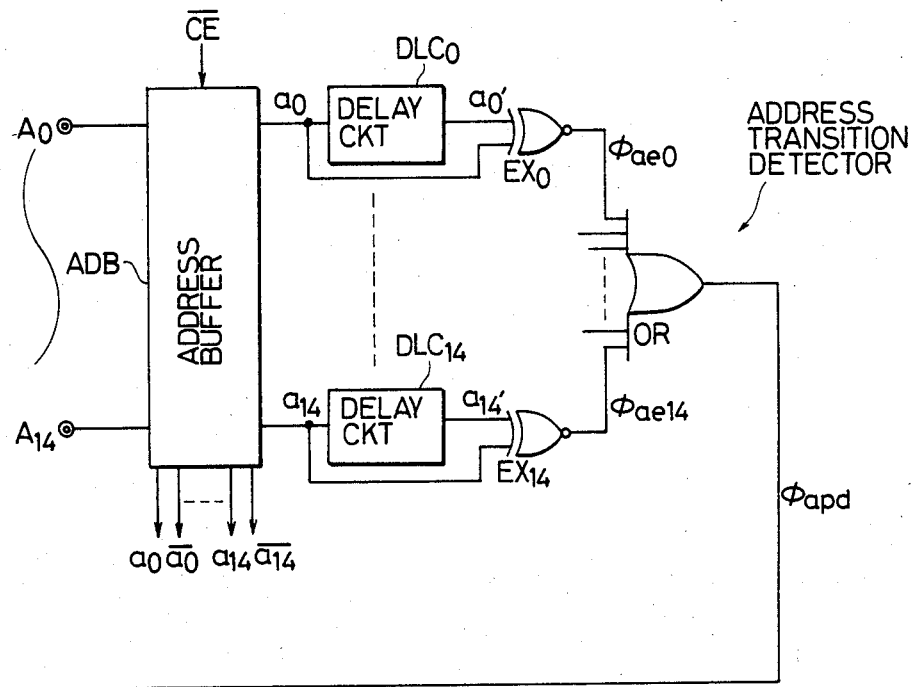
FIG. 11 is a block diagram of an example of each of an address transition detector ATD and a control signal generator CSG such as used in FIG. 1.
Figure 11:
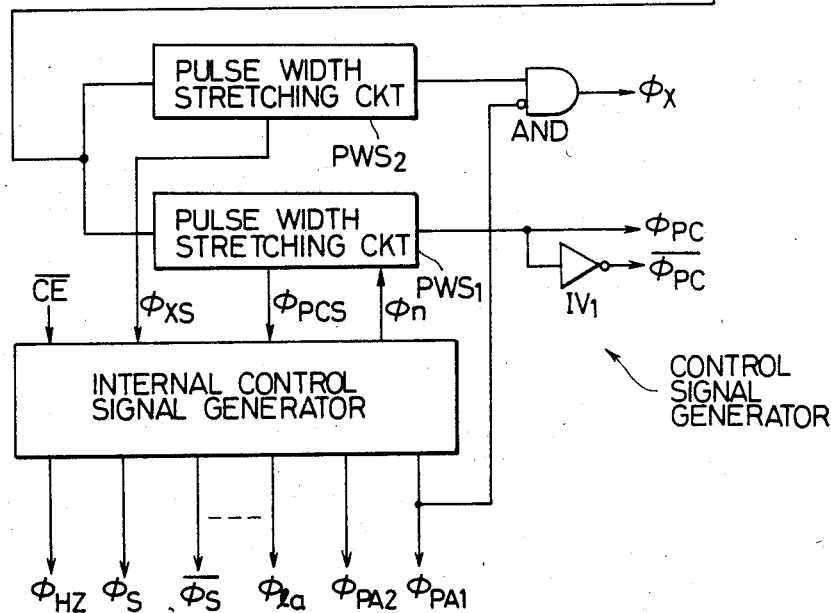

FIG. 11 illustrates detailed block diagrams of the address transition detector and the control signal generator which are shown in FIG. 1.

The internal address signals a$_0$ to a$_{14}$ formed in the address buffer ADB are fed to delay circuits DLC$_0$ to DLC$_{14}$, respectively. The delay circuits DLC$_0$ to DLC$_{14}$ form delay signals a$_0$' to a$_{14}$' delayed with respect to the internal address signals a$_0$ to a$_{14}$. The internal address signals a$_0$ through a$_{14}$ and the delay signals a$_0$' through a$_{14}$' are fed to exclusive OR circuits EX$_0$ through EX$_{14}$, respectively. Each of the outputs of the exclusive OR circuits EX$_0$ through EX$_{14}$ is supplied to an OR gate circuit OR. This OR gate circuit OR forms a trigger pulse $\phi_{apd}$.

Figure 13:
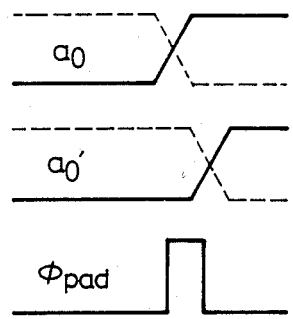
FIG. 13 is a waveform chart for describing the operation of the address transition detector ATD of FIG. 11.

For example, as the internal address signal $a_0$ changes as shown in FIG. 13, the levels of the respective input signals $a_0$ and $a_0'$ supplied to the exclusive OR circuit $EX_0$ do not coincide with each other during the delay of the delay circuit $DLC_0$. As a result, the exclusive OR circuit $EX_0$ forms a pulse having a pulse width corresponding to the delay. This pulse is delivered as the trigger pulse $\phi_{apd}$ via the OR gate circuit OR. Accordingly, the address transition detector ATD forms the trigger pulse $\phi_{apd}$ when either one of the internal address signals $a_0$ to $a_{14}$ changes.

Figure 12:
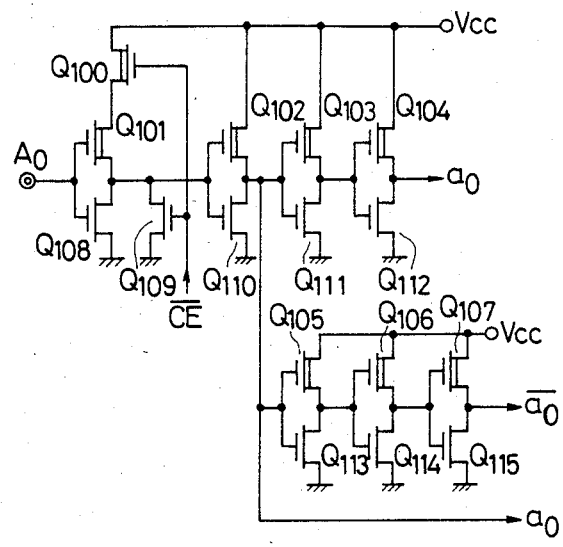
FIG. 12 is a circuit diagram of an example of an address buffer ADB as used in FIGS. 1 and 11.

Although not especially limitative, the address buffer ADB of FIG. 11 is constituted by a static circuit in order to permit the address transition detector ATD to form the trigger pulse $\phi_{apd}$ even if the external address signals $A_0$ through $A_{14}$ change asynchronously. Although not especially limitative, in the embodiment, the address buffer is constituted by a CMOS circuit composed of P-channel MOSFETs and N-channel MOSFETs. FIG. 12 shows an example of the static address buffer of FIG. 11 constituted by a CMOS circuit. Although the Figure shows only the unit address buffer which receives the external address signal $A_0$ and forms the address signals $a_0$ and $\overline{a_0}$ complementary to each other, practically the same unit address buffers are provided with respect to the other address signals.

The unit address buffer with respect to the external address signal $A_0$ is constituted by P-channel MOSFETs $Q_{100}$ through $Q_{107}$ and N-channel MOSFETs $Q_{108}$ through $Q_{115}$. More specifically, the unit address buffer is constituted by a two-input NOR gate circuit and six inverters. The two-input NOR gate circuit is supplied with the external address signal $A_0$ and the chip selecting signal $\overline{CE}$. The internal address signal $a_0$ delivered from the inverter constituted by the P-channel MOSFET $Q_{104}$ and the N-channel MOSFET $Q_{112}$ and the internal address signal $\overline{a_0}$ delivered from the inverter constituted by the P-channel MOSFET $Q_{107}$ and the N-channel MOSFET $Q_{115}$ are transmitted to the X decoders $X\text{-}DCR_1$ and $X\text{-}DCR_2$, respectively. On the other hand, the internal address signal $a_0$ delivered from the inverter constituted by the P-channel MOSFET $Q_{102}$ and the N-channel MOSFET $Q_{110}$ is transmitted to the address transition detector ATD.

Similarly to the address buffer, the exclusive OR circuit in the address transition circuit are constituted by static circuits, respectively. For example, such an exclusive OR circuit as shown in FIG. 8 is employed as each of the exclusive OR circuits.

Figure 14:
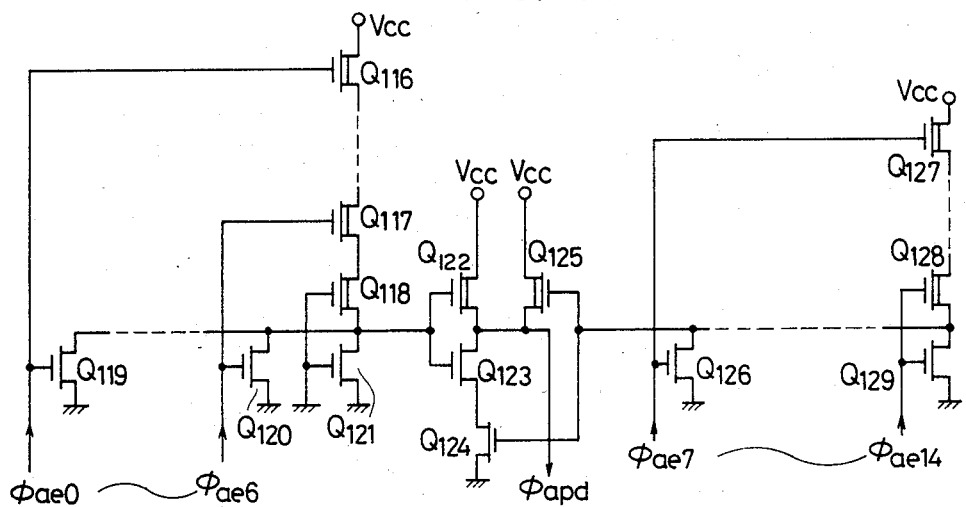
FIG. 14 is a circuit diagram of an example of an OR circuit of FIG. 11.

Although not especially limitative, the OR gate circuit OR of FIG. 11 can be constituted by such a CMOS circuit as shown in FIG. 14. More specifically, the OR gate circuit OR is constituted by MOSFETs $Q_{116}$ through $Q_{129}$.

The OR gate OR is constituted by two NOR gate circuits and one NAND gate circuit. One NOR gate circuit is constituted by the P-channel MOSFETs $Q_{116}$ through $Q_{118}$ and the N-channel MOSFETs $Q_{119}$ through $Q_{121}$, the other NOR gate circuit is constituted by the P-channel MOSFETs $Q_{127}$ to $Q_{128}$ and the N-channel MOSFETs $Q_{126}$ to $Q_{129}$, and the NAND gate circuit is constituted by the P-channel MOSFETs $Q_{122}$, $Q_{125}$ and the N-channel MOSFETs $Q_{123}$, $Q_{124}$.

Each of the output signals of the respective exclusive OR circuits $EX_0$ through $EX_{14}$ is supplied to the NOR gate circuits, and the output signals from the two NOR gate circuits are supplied to the NAND gate circuit, from which the trigger pulse $\phi_{apd}$ is taken out.

The control signal generator CSG shown in FIG. 11 comprises two pulse width stretching circuits each constituted by a static circuit, and an internal control signal generator, although not especially limitative thereto. The control signal generator CSG receives the trigger pulse $\phi_{apd}$ and forms various timing signals required to operate the ROM. In the Figure, only essential timing signals, i.e., various timing singles such as mentioned hereinbefore, are shown in order to simplify the description. FIG. 18 shows waveforms of the timing signals $\phi_{XS}$, $\phi_{PCS}$, $\phi_X$, $\phi_{PC}$, $\phi_{PA1}$, $\phi_{PA2}$, $\phi_{Ia}$, $\phi_X$ and $\phi_{HZ}$ in the essential timing signals. The precharging signal $\overline{\phi_{PC}}$ and the timing signal $\overline{\phi_S}$ are omitted in FIG. 18, but these signals $\overline{\phi_{PC}}$ and $\overline{\phi_S}$ are signals formed by phase-inverting the timing signals $\phi_{PC}$ and $\phi_S$, respectively.

In the two pulse width stretching circuits $PWS_1$ and $PWS_2$ shown in FIG. 11, one pulse width stretching circuit $PWS_1$ forms the precharging signal $\overline{\phi_{PC}}$, the timing signal $\phi_{PC}$ formed by phase-inverting the same, and the reference signal $\phi_{PCS}$ required to generate the above-mentioned various signals from the internal control signal generator. The reference signal $\phi_{PCS}$ is a signal formed by stretching the pulse width of the trigger pulse $\phi_{apd}$ by the pulse width stretching circuit $PWS_1$ and is adjusted so as to have a predetermined pulse width. Moreover, the timing signal $\phi_{PC}$ is a signal decaying in synchronism with the rising of the reference signal $\phi_{PCS}$. Consequently, the precharging signal $\overline{\phi_{PC}}$ rises in synchronism with the decaying of the reference signal $\phi_{PCS}$. The precharging of the capacitances in the data lines formed in the memory arrays and the precharging of the sense amplifier are carried out when the precharging signal $\overline{\phi_{PC}}$ is low. Accordingly, the precharging time is restricted in accordance with the reference signal $\phi_{PCS}$ formed by stretching the pulse width of the trigger pulse $\phi_{apd}$. The pulse width stretching operation in the pulse width stretching circuit can be realized by, for example, the combination of the delay circuits and the logical gate circuits.

The other pulse width stretching circuit $PWS_2$ forms the word line selecting timing signal $\phi_X$, and the reference signal $\phi_{XS}$ required to generate the above-mentioned various timing signals from the internal control signal generator similarly to the reference signal $\phi_{PCS}$. The reference signal $\phi_{XS}$ is, similarly to the reference signal $\phi_{PCS}$, a signal formed by stretching the pulse width of the trigger pulse $\phi_{apd}$ and has a pulse width adjusted to the time required to raise the level of the word lines to the selection level of the memory cells.

The internal control signal generator receives the above-described two reference signals $\phi_{PCS}$ and $\phi_{XS}$ and forms the timing signals $\phi_S$, $\phi_{PA1}$, $\phi_{PA2}$, $\phi_{Ia}$ and $\phi_{HZ}$ shown in FIG. 18.

By thus forming the timing signals essential for operating the ROM in the respective pulse width stretching circuits, it is possible to set the essential timing signals separately from each other, so that designing is facilitated and moreover, the following advantages are offered.

Namely, since the reference signal $\phi_{PCS}$ for regulating the precharging period for the data lines and the like and the reference signal $\phi_{XS}$ for regulating the time required to raise the level of the word lines to the selective level of the memory cells are supplied to the internal control signal generator from the respective pulse width stretching circuits, if the readout timing is determined on the basis of these two kinds of reference signals, then it is possible to obtain a ROM capable of conducting an accurate data readout operation. More specifically, the two pulse width stretching circuits PWS$_1$ and PWS$_2$ are simultaneously formed. Therefore, if the characteristics of the pulse width stretching circuit PWS$_1$ should change owing to manufacturing condition variations, the characteristics of the pulse width stretching circuit PWS$_2$ also change in the same manner. For example, if the pulse width of the reference signal $\phi_{PCS}$ should enlarge owing to manufacturing condition variations, the pulse width of the reference signal $\phi_{XS}$ also enlarges in the same manner. However, the relationship between the two kinds of reference signals, for example, the relationship that the reference signal $\phi_{XS}$ rises after a predetermined time has passed after the decaying of the reference signal $\phi_{PCS}$, is maintained independently of the manufacturing condition variations. Consequently, there is no possibility that, for example, the timing signal $\phi_S$ which rises in response to the decaying of the reference signal $\phi_{PCS}$ and decays in response to the decaying of the reference signal $\phi_{XS}$ is not generated owing to the manufacturing condition variations. In other words, it is possible to obtain a ROM hardly affected by manufacturing condition variations.

Although not especially limitative, in the embodiment, the decaying of the precharging signal $\overline{\phi_{PC}}$ is controlled by the timing signal $\phi_n$ synchronized with the timing signal $\phi_{PA1}$ for activating the sense amplifier in order to reduce the power consumption. Thus, the arrangement is such that the precharging of the data lines, the unit sense amplifiers and the like are started at the time when the signals from the memory cells are amplified by the unit sense amplifiers respectively. For instance, if the precharging is not carried out after the signals from the memory cells are amplified by the respective unit sense amplifiers, the electric charge in the stray and parasitic capacitances of the data lines connected with the memory cells not selected will be leaked with time. A comparatively large power is required to precharge again the capacitances of the data lines once discharged. Therefore, in the embodiment, the stray and parasitic capacitances of the data lines are precharged immediately after the signals from the memory cells are amplified by the respective unit sense amplifiers as described above.

Before the starting of this precharging operation, the signal amplified in each unit sense amplifier is transmitted via the MOSFETs Q$_8$ and Q$_9$ to the main amplifier in the respective unit latching circuit. More specifically, since the transfer MOSFETs Q$_8$ and Q$_9$ are held ON during the period when the timing signal $\phi_{PA2}$ is held high, the signal amplified in the unit sense amplifier is transmitted to the main amplifier via the transfer MOSFETs Q$_8$ and Q$_9$. When the precharging of the data lines and the like is started, the timing signal $\phi_{PA2}$ is made low. Consequently, the MOSFETs Q$_8$ and Q$_9$ are turned OFF, so that the pair of input/output terminals of the unit sense amplifier and the input/output terminal of the main amplifier are electrically separated from each other. Accordingly, there is no possibility that the input/output terminal of the main amplifier is precharged by the above-described precharging of the data lines and the like.

As described later in detail, in the embodiment, the level of the word lines is brought to the nonselection level of the memory cells after the data in memory cells are transmitted to the data lines in order to reduce the power consumption of the ROM. More specifically, the arrangement is such that, as shown in FIG. 11, the word line selecting timing signal $\phi_X$ is delivered via a gate circuit AND controlled by the signal $\phi_{PA1}$ for activating the sense amplifier. Thus, as the sense amplifier starts to operate, the level of all the word lines is brought to the nonselection level of the memory cells.

The operation of the embodiment will be described hereinunder through waveforms shown in FIG. 18.

First of all, the external address signals A$_0$ through A$_{14}$ are changed in order to read out data from desired memory cells. Thereupon, the trigger pulse $\phi_{apd}$ is generated from the address transition detector ATD.

One pulse width stretching circuit PWS$_1$ receives the trigger pulse $\phi_{apd}$ and forms the reference signal $\phi_{PCS}$ for regulating the precharging time of the data lines and the like. On the other hand, the other pulse width stretching circuit PWS$_2$ forms, in response to the decaying of the trigger pulse $\phi_{apd}$, the word line selecting timing signal $\phi_X$ and the reference signal $\phi_{XS}$ having a pulse width corresponding to the time required to raise the level of the word lines to the selection level of the memory cells. The rising of the word line selection timing signal $\phi_X$ causes the potentials of the word lines connected with the desired memory cells and those of the corresponding dummy word lines to start to rise.

When a predetermined time has passed after the change of the address signals, i.e., when the time has passed which is required to precharge the stray and parasitic capacitances of the data lines, the sense amplifier and the like, the reference signal $\phi_{PCS}$ decays. In response thereto, the internal control signal generator raises a timing signal $\phi_S$ as well as decays a timing signal $\phi_{PC}$. The decaying of the timing signal $\phi_{PC}$ terminates the precharging of the data lines, the sense amplifier and the like. On the other hand, the main amplifier starts to be precharged in response to the rising of the timing signal $\phi_S$.

Moreover, the internal control signal generator decays the timing signal $\phi_{la}$ to the low level, subsequently to the rising of the timing signal $\phi_S$ to the high level. Thereby, the main amplifier and the inverter in the stage subsequent thereto which have been activated heretofore are inactivated.

Consequently, the potential at the node NB$_n$ of the main amplifier changes from the value delivered heretofore to the precharging level (the supply voltage V$_{CC}$).

Moreover, in response to the rising of the timing signal $\phi_S$, the discharging MOSFETs of the ground lines connected with the desired memory cells and the discharging MOSFETs of the ground lines connected with the dummy cells corresponding to the desired memory cells are turned ON. Further, the timing signal $\phi_{PC}$ decays at this time. Consequently, the MOSFETs constituting the column switches which have connected all the data lines to the sense amplifier in order to precharge the data lines operate so as to connect to the sense amplifier only the data lines connected with the desired memory cells and the data lines connected with the dummy cells corresponding to the desired memory cells. Accordingly, the data stored in one desired memory cell is transmitted to one input/output terminal of the corresponding unit sense amplifier, as a change in potential of the data line, and the reference voltage from the corresponding dummy cell is transmitted to the other input/output terminal of the unit sense amplifier. More specifically, the potential of the data line DL$_n$ connected with one desired memory cell changes as shown by a broken line or solid line in accordance with the data stored in the memory cell, as shown in the Figure.

Next, the reference signal $\phi_{XS}$ decays. By this time, the potentials of the word lines connected with the desired memory cells have risen to a certain extent.

In response to the decaying of the reference signal $\phi_{XS}$, the internal control signal generator decays the timing signal $\phi_S$. This terminates the precharging operation for the main amplifier.

In synchronism with the decaying of the timing signal $\phi_S$, the internal control signal generator raises the timing signal $\phi_{PA1}$ for activating the sense amplifier. Thereby, the sense amplifier starts to amplify the potential difference between each of the data lines connected with the above-mentioned memory cells and the corresponding one of the data lines connected with the above-mentioned dummy cells.

In addition, the internal control signal generator decays the word line selecting timing signal $\phi_X$ in synchronism with the rising of the timing signal $\phi_{PA1}$. In other words, the word lines are brought to the nonselection level. Thereby, the power consumption of the ROM is reduced in comparison to conventional devices, as will be described in more detail hereinafter.

As described above, as the sense amplifier starts to operate, the potential of the data line $DL_n$ connected with a desired memory cell largely changes in accordance with the data stored therein as shown in the Figure.

When the potential difference between the above-mentioned pair of data lines is amplified to a certain extent by the sense amplifier, the internal control signal generator raises the timing signal $\phi_{PA2}$. Thereby, the output signal from the sense amplifier is transmitted to the main amplifier.

Subsequently to the rising of the timing signal $\phi_{PA2}$, the internal timing signal generator raises the timing signal $\phi_{la}$ to the high level again. In response to the rising of the timing signal $\phi_{la}$, the main amplifier and the inverter are activated, and the output signal transmitted from the sense amplifier is amplified as well as latched and then transmitted to the ECC circuit. More specifically, the level at the node $NB_n$ of the main amplifier changes from the precharging level to the level corresponding to the data read out from a desired memory cell. Consequently, the inverter stops delivering the old data held in the stray and parasitic capacitances coupled to its output node and starts to deliver a new data.

Moreover, the ECC circuit starts to deliver new data after delivering indefinite data during a certain time determined by the time required for the inverter to change its output content from the old data to the new data and the delay of the ECC circuit itself.

The timing signal $\phi_{HZ}$ is held low during the time when the ECC circuit is delivering indefinite data. Consequently, during this period, the external output terminal $DO_0$ through $DO_7$ are in the floating state. Thereafter, new data is delivered from the external output terminals.

Moreover, the internal control signal generator raises the timing signal $\phi_{PC}$ to the high level again after decaying the timing signal $\phi_{PA1}$ to the low level. Thereby, the precharging operation for the data lines, the sense amplifier and the like is resumed.

It is to be noted that since previous data is held by the inverter in the stage subsequent to the main amplifier during the time from the main amplifier is inactivated until the same is activated again by the timing signal $\phi_{la}$, the output signals $D_n$ from the ECC circuit and the output signals $DO_n$ from the respective external output terminals are the previous data.

Figure 17:
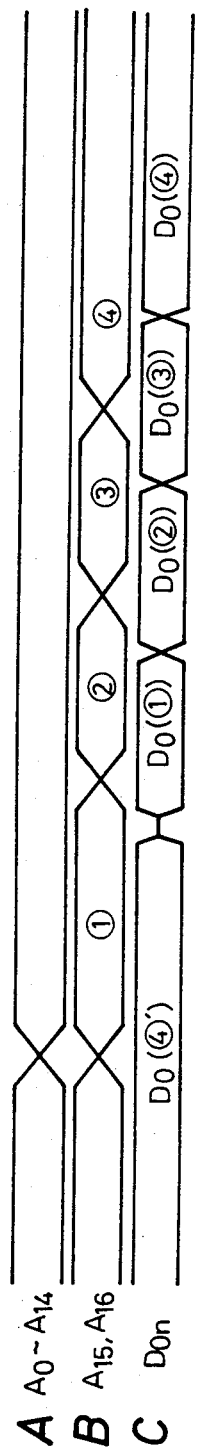
FIG. 17 a core timing charts for describing how data is taken out in a time division manner.

The following is a description of the relationship between the external address signals and the output data $DO_n$ (n=0 to 7) from the external output terminals. FIG. 17 shows the relationship between the external address signals $A_0$ through $A_{16}$ and the output data $DO_n$.

When either one of the external address signals $A_0$ through $A_{14}$ changes, the 32-bit data is delivered from the ECC circuit as described hereinbefore. In the embodiment, the 32-bit data can be taken out from the external output terminals in four sets in a time division manner, although especially limitative thereto. More specifically, it is possible to determine which one of the four sets should be taken out, according to the combination of the external address signals $A_{15}$ and $A_{16}$.

As shown in FIG. 17, if the external address signals $A_{15}$ and $A_{16}$ are combined as at ①, then eight-bit data shown by DO (①) is delivered from the external output terminals. If the external address signals $A_{15}$ and $A_{16}$ are combined as at ② subsequently thereto, then eight-bit data shown by DO (②) is delivered in a short period of time. Thereafter, in the same manner, eight-bit data shown by DO (③) and eight-bit data shown by DO (④) are delivered successively in a short period of time.

The reason why the data DO (②), the data DO (③) and the data DO (④) are delivered in a short period of time is that the data DO (②) through DO (④) have already reached the output nodes of the ECC circuit by the time the data DO (①) is delivered.

In the embodiment, as described above, the memory cell arrays, the dummy cell arrays, the sense amplifier and the latching circuit are constituted by dynamic circuits respectively, while the other circuits are constituted by static circuits respectively. The internal timing signals required for the operations of the dynamic circuits are all formed inside the ROM by detecting the changes of the address signals, i.e, in accordance with the timing of the starting of the readout access operation of the ROM. Accordingly, signals supplied from the outside in the readout operation can be made substantially the same as signals in a static ROM, so that the handling of the ROM becomes extremely easy.

On the other hand, the internal essential circuits, i.e., the memory cell arrays, the dummy cell arrays and the sense amplifier are constituted by dynamic circuits respectively. Therefore, it is possible to make the power consumption smaller and the integration degree higher. In the readout operation, the dynamic circuits are precharged by utilizing the time required for the memory cell selecting operation. In addition, as the sense amplifier, a highly sensitive differential amplifier circuit is employed. Therefore, it is possible to read out the contents of the memory cells at an extremely high speed.

Moreover, in the embodiment, the word lines are brought to the nonselection level again after being brought to the selection level of the memory cells for a readout operation. Thereby, the power consumption of the ROM is reduced. More specifically, if the word lines are not brought to the nonselection level again after being brought to the selection level of the memory cells for a readout operation, a large ineffectively-consumed current undesirably flows for the following reasons.

For instance, in the case where the storage MOSFETs (memory cells) $M_0$ through $M_6$ have data "0" written therein in FIGS. 2A and 2B, when, in order to select, for example, the storage MOSFET $M_0$, the word line $W_{512}$ is brought to the selection level (high level) and the ground line $G_0$ is brought to the low level, the electric charge stored in the stray and parasitic capacitances of the data line $DL_0$ is discharged via the storage MOSFET $M_0$. In accordance therewith, the potential of the data line $DL_0$ gradually lowers. By the way, the capacitances of the data lines and those of the ground lines are all precharged beforehand. Therefore, all the data and the ground lines except for the data line $DL_0$ connected with the selected memory cell and the ground line $G_0$ are held at the precharging level (high level) at this time. Consequently, with respect to the memory MOSFET $M_1$, the electrode thereof connected to the data line $DL_0$ is made to function as a source, and the electrode thereof connected to the ground line $G_1$ is made to function as a drain. Accordingly, when the potential of the data line $DL_0$ gradually lowers until it becomes lower than the threshold voltage of the memory MOSFET $M_1$ with respect to the potential of the word line $W_{512}$, the memory MOSFET $M_1$ also turns ON. As a result, the electric charge stored in the stray and parasitic capacitances of the ground line $G_1$ is also discharged via the memory MOSFETs $M_0$ and $M_1$. Thus, the level of the ground line $G_1$ also gradually lowers. With respect to also the memory MOSFET $M_2$, in the same manner, the electrode thereof on the side of the ground line $G_1$ is made to function as a source, and the electrode thereof on the side of the data line $DL_1$ is made to function as a drain. Accordingly, when the level of the ground line $G_1$ becomes lower than the threshold voltage of the memory MOSFET $M_2$ with respect to the level of the word line $W_{512}$, the memory MOSFET $M_2$ also turns ON. In consequence, the electric charge stored in the capacitances of the data line $DL_1$ is discharged via the MOSFETs $M_0$, $M_1$ and $M_2$, and as a result, the potential of the data line $DL_1$ also gradually lowers. Then, the memory MOSFETs $M_3$ through $M_6$ undergo the same phenomena as the memory MOSFETs $M_1$ and $M_2$, so that the electric charge stored in the stray and parasitic capacitances of each of the ground lines $G_2$, $G_3$ and the data lines $DL_2$, $DL_3$ is undesirably discharged. More specifically, the electric charge precharged beforehand in the stray and parasitic capacitances of each of the data lines $DL_1$ through $DL_3$ and the ground lines $G_1$ through $G_3$ is undesirably discharged. Consequently, a relatively large ineffectively-consumed current disadvantageously flows. Moreover, in the subsequent readout operation, these stray and parasitic capacitances having been discharged must be precharged again. Accordingly, the power consumption unfavorably becomes large.

In the embodiment, therefore, the level of the word lines is brought to the nonselection level again after the level of the word lines is brought to the selection level and the data stored in the selected memory cell is taken out to the data line. Thus, it is possible to reduce the number of the above-mentioned memory MOSFETs to turn ON, so that the flowing of a large ineffective current can be prevented. For example, with respect to the memory MOSFET $M_1$, when the word line $W_{512}$ is brought to the selection level and the memory MOSFET $M_0$ is turned ON, the potential of the data line $DL_0$ gradually lowers. If the word line $W_{512}$ is held at the selection level as it is, the potential of the data line $DL_0$ will become lower than the threshold voltage of the storage MOSFET $M_1$ with respect to the level of the word lines, resulting in a large power consumption of the ROM as described above. Therefore, the level of the word lines is brought to the nonselection level before the potential of the data line $DL_0$ becomes lower than the threshold voltage of the memory MOSFET $M_1$ with respect to the level of the word lines. Thus, the memory MOSFET $M_1$ will not turn ON, and it is possible to prevent the flowing of a large ineffective current.

The above description is that the word lines are brought to the nonselection level in order to prevent the memory MOSFETs other than the selected memory MOSFET from undesirably turning ON. In order to allow the potential of a data line to largely change in accordance with the data stored in a selected memory MOSFET, however, it is desirable to bring the word line to the nonselection level before either one of the memory MOSFETs $M_2$ through $M_6$ turns ON. For example, if the arrangement is such that the word line $W_{512}$ is brought to the nonselection level after it is brought to the selection level and before the memory MOSFET $M_2$ turns ON, the memory MOSFET $M_1$ turns ON, and the potential of the ground line $G_1$ gradually lowers. However, a considerably large amount of electric charge stored in the capacitances of the ground line $G_1$ needs to be discharged until the potential of the ground line $G_1$ becomes lower than the threshold voltage of the memory MOSFET $M_2$ with respect to the level of the word line $W_{512}$; therefore, it takes a comparatively long period of time. During this period, the potential of the data line $DL_0$ largely lowers. Accordingly, it is possible to take out to the data line $DL_0$ a large level in accordance with the data stored in the selected memory MOSFET $M_0$.

In practice, as shown in FIG. 11, the word line selecting timing signal $\phi_x$ delivered from the control signal generator CSG is controlled by means of the timing signal $\phi_{PA1}$ for activating the sense amplifier. Thereby, the word lines are brought to the selection level, and then, after a predetermined time has passed, the word lines are brought to the nonselection level. More specifically, in the embodiment, when the sense amplifier is actuated, all the word lines are brought to the nonselection level.

Although not especially limitative, in the dummy cell arrays, the compensating circuits are OFF at all times. In other words, the compensating circuits are constituted by the MOSFETs, accompanied by a mark x, formed simultaneously with the memory MOSFETs in which binary signals "1" are written. These MOSFETs equalize the total numbers of the MOSFETs connected to each dummy word line and those connected to each word line. Thus, it is possible to equalize the stray and parasitic capacitances coupled to the dummy word line and those connected to the word line, so that the dummy word line and the word line can be made equal in the rising timing to each other. Thus, in the readout operation of the ROM, even if the timing of selecting the word lines and the dummy word lines is behind the discharging of the memory arrays, the gate voltages of the memory cell and the dummy cell will be equal to each other. Consequently, a voltage in accordance with the conductance ratio between the memory cell and the dummy cell is applied between both the input terminals of the sense amplifier, so that no malfunction will occur. Such an arrangement of memory cells and dummy cells can be used for ordinary static ROMs or dynamic ROMs.

The compensating circuit may be constituted by a capacitor, since the compensating circuit is required only to make the value of the capacitances connected to the dummy word line and that of the capacitances connected to the word line substantially equal to each other. More specifically, the arrangement may be such that a capacitor is connected to the dummy word line so that the value of the capacitances coupled to the word line and that of the capacitances coupled to the dummy word line are substantially equal to each other.

It is, however, desirable to constitute the compensating circuit by MOSFETs. This is because if the value of capacitances of a memory MOSFET should change owing to manufacturing condition variations, the value of capacitances of a MOSFET constituting the compensating circuit also similarly changes; therefore, it is possible to make the value of the capacitances connected to the dummy word line and that of the capacitances connected to the word line substantially equal to each other independently of manufacturing condition variations. More specifically, if, for example, the overlapping amount between the source region and the gate electrode of a memory MOSFET and the overlapping amount between the drain region thereof and the gate electrode thereof should change owing to manufacturing condition variations, since a MOSFET constituting the compensating circuit is formed simultaneously with the memory MOSFET, also in the MOSFET constituting the compensating circuit, the overlapping amount between the source region and the gate electrode and the overlapping amount between the drain region and the gate electrode change in the same manner as those in the memory MOSFET owing to the manufacturing condition variations. Accordingly, it is possible to make the value of capacitances of the memory MOSFET and that of capacitances of the MOSFET constituting the compensating circuit substantially equal to each other independently of the manufacturing condition variations. Thus, it is possible to make the value of the capacitances coupled to the dummy word line and that of the capacitances coupled to the word line substantially equal to each other independently of manufacturing condition variations.

In case of constituting the compensating circuit by a MOSFET, since it is only necessary to equalize the numbers of MOSFETs connected to the dummy word line and those connected to the word line, any MOSFET can be employed, provided that the MOSFET has such an arrangement that the gate thereof is connected to the dummy word line, and the data line and the ground line are made nonconductive. For instance, the arrangement may be such that the compensating circuit is not connected to the data line and the ground line.

In the case where the ECC circuit is incorporated in the ROM, it is possible to largely improve the production yield of the semiconductor memory owing to the error correcting function of the ECC circuit.

In the case where an ECC circuit is incorporated in a one-chip semiconductor memory to redress any defective memory cell thereby to improve the production yield, an ECC circuit having the one-bit error correcting function requires, for example, four-bit parity signals for eight-bit data; six-bit parity signals for 32-bit data; and eight-bit parity signals for 100-bit data. Thus, when the number of data bits is smaller, the percentage of the number of parity bits with respect to the whole is larger, so that the practical memory capacity of the memory cell arrays decreases. On the other hand, if the number of data bits is increased, it is necessary to provide a large number of external terminals for the data output; therefore, it is difficult to incorporate the ECC circuit in the semiconductor memory.

The ROM in accordance with the embodiment is arranged such that data of a plurality of bits delivered from the ECC circuit is taken out in several stages by means of the multiplexor MPX as described hereinbefore. Thereby, it is possible to increase the number of data bits and reduce the percentage of the number of necessary parity bits with respect to the whole without increasing the number of output terminals of the IC chip. Accordingly, the practical memory capacity of the memory arrays can be enlarged.

In general, in a monolithic IC type large-capacity memory, defects apt to be produced simultaneously in a plurality of memory cells adjacent to each other are attributable to, for example, the inevitable imperfection of the IC manufacturing technique. For example, a mask film which comprises a photoresist provided for selectively etching an insulation film and a conductor film is not necessarily excellently processed owing to the lack of uniformity of the material and the adverse effect of unneglectable dust and the like. If the pattern of the processed mask film should have defects such as undesirable unevenness and pinholes, the defectives are unfavorably transferred to the insulation film and conductor film to be processed by the mask film. If there should be any defect in the mask film employed for the impurity ion implantation, impurity ions are introduced into an undesired portion on the semiconductor substrate surface or the impurity ions are not introduced into a desired portion. The semiconductor substrate to be employed, on the other hand, has defects such as the crystal defect which brings defects to the characteristics of the semiconductor elements to be formed thereon.

In the large-capacity memory, semiconductor elements and wiring layers are made to have minute dimensions in order to attain a higher density. In consequence, a plurality of circuit elements are apt to be included in one defect area. Accordingly, a plurality of defective cells are liable to be produced in a concentrated area. In the readout operation of the ROM in accordance with the embodiment, each of a plurality of memory MOSFETs from which data are simultaneously taken out is selected from one of the unit memory cell arrays corresponding to the unit sense amplifiers as described hereinbefore. More specifically, a plurality of bits fed to the ECC circuit are taken out from the memory MOSFETs formed at positions on the semiconductor substrate distributed away from each other. The data read out from a plurality of defective cells concentratively produced is dispersed in a plurality of sets of data. As a result, the error bit included in one set of data can be reduced to on the order of one bit at maximum. Therefore, even an ECC circuit having a low error correcting capability (correcting capability of one bit) is able to correct the error bit. Accordingly, it is possible to largely improve the production yield of the semiconductor memory.

If the memory cell arrays, the dummy cell arrays and the sense amplifier are constituted by dynamic circuits respectively as in the case of the embodiment, static readout data and parity signals can be supplied to the ECC circuit by providing a practical latching circuit. In consequence, the ECC circuit can be constituted by a simple static circuit. In other words, it becomes possible to simplify the construction and operation of the ECC circuit.

Moreover, the current consumption can be reduced by thus providing the practical latching circuit. More specifically, if no latching circuit is provided, the changes of the sense amplifier output signals caused by the precharging operation are undesirably supplied to the ECC circuit. Consequently, the ECC circuit is actuated when the operation thereof is not desired. The undesirable operation of the ECC circuit increases the current comsumption. The provision of the latching circuit prevents the changes of the output signals of the sense amplifier caused by the precharging operation from being transmitted to the ECC circuit. More specifically, during the time when the memory arrays, the sense amplifier, the main amplifier and the like are being precharged, the output terminals of the ECC circuit and the main amplifier are practically separated from each other by the tristate circuits. Therefore, the potential change at the output terminal of the main amplifier caused by the precharging operation is not transmitted to the ECC circuit. Accordingly, it is possible to prevent the ECC circuit from being undesirably actuated; hence, it is possible to prevent the increase in the current consumption.

Since the static circuits are constituted by CMOS circuits respectively, the power consumption of the ROM can be reduced.

The above-described embodiment of the invention is not exclusive.

Such an arrangement may be employed that the address buffer for receiving the external address signals delivered from the outside and the output buffer for forming the output signals delivered to the outside are constituted by static circuits respectively and the other circuits are all constituted by dynamic circuits respectively. It is to be noted that in the case where also the address decoders are constituted by static circuits respectively, the address selecting operation is initiated immediately after application of the external address signals. In this case, such an advantage is offered that the memory arrays, the dummy cell arrays, the sense amplifier and the like can be precharged by utilizing the period from the application of the external address signals until the selection of addresses.

The invention can be widely used for vertical mask ROMs, programmable ROMs (electrically programmable ROMs), electrically alterable ROMs, etc, in addition to the above-described horizontal mask ROMs. It is possible to variously change and modify the memory cell arrays, the dummy cell arrays, the unit sense amplifiers, the address decoders, the control signal generator and the like.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A semiconductor memory comprising:
a plurality of external output terminals;
a plurality or memory cells formed in one semiconductor chip for storing a plurality of sets of data each having check bits;
a selecting circuit which is formed in said semiconductor chip and which selects some of said memory cells to be formed into one set in response to first address signals;
an error correcting code circuit formed in said semiconductor chip and supplied with one set of data read out from the selected memory cells;
a tristate circuit formed in said semiconductor chip, having a plurality of output terminals and supplied with data delivered from said error correcting code circuit; and
a control circuit formed in said semiconductor chip for forming a control signal for controlling said tristate circuit;
wherein the output terminals of said tristate circuit are coupled with said external output terminals, and wherein said tristate circuit is controlled by the control signal of said control circuit so as to bring said external output terminals into high impedance at least during the time when said error correcting code circuit is delivering indefinite data.

2. A semiconductor memory according to claim 1, further comprising a multiplexor provided between said error correcting code circuit and said tristate circuit, and a selecting circuit for controlling the operation of said multiplexor in response to second address signals, said multiplexor including means for transmitting output signals indicated by said second address signals from among the output signals delivered from said error correcting code circuits to said tristate circuit.

3. A semiconductor memory according to claim 1 or 2, wherein each of said memory cells is comprised of a read-only memory cell.

* * * * *